United States Patent [19]

Kumakhov

[11] Patent Number: 5,192,869

[45] Date of Patent: Mar. 9, 1993

[54] DEVICE FOR CONTROLLING BEAMS OF PARTICLES, X-RAY AND GAMMA QUANTA

[75] Inventor: Muradin A. Kumakhov, Moscow, U.S.S.R.

[73] Assignee: X-Ray Optical Systems, Inc., Voorheesville, N.Y.

[21] Appl. No.: 678,208

[22] Filed: Apr. 1, 1991

Related U.S. Application Data

[63] Continuation-in-part of Ser. No. 607,456, Oct. 31, 1990 abandoned.

[51] Int. Cl.⁵ ............................................ G02B 5/124
[52] U.S. Cl. ........................... 250/505.1; 313/103 CM
[58] Field of Search ............. 250/505.1; 313/103 CM, 313/105 CM; 378/34, 35

[56] References Cited

U.S. PATENT DOCUMENTS

| | | | |
|---|---|---|---|
| 3,979,621 | 9/1976 | Yates | 313/105 CM |
| 3,979,637 | 9/1976 | Siegmund | 313/105 CM |
| 4,950,939 | 8/1990 | Tosswill | 313/105 CM |
| 5,001,737 | 3/1991 | Lewis et al. | 378/147 |
| 5,016,267 | 5/1991 | Wilkins | 378/84 |

*Primary Examiner*—Jack I. Berman
*Assistant Examiner*—Kiet T. Nguyen
*Attorney, Agent, or Firm*—Lieberman, Rudolph & Nowak

[57] ABSTRACT

A device for controlling beams of particles, X-rays and gamma rays including a plurality of channels with total external reflection inner surfaces, input butt-ends facing a radiation source and output butt-ends aimed at a radiation receiver is taught. Channel-forming elements are in the form of surfaces, tubes, and structures with multiple channels and are rigidly positioned one relative to another with a spacing between supports such that the sagging of the channel-forming elements does not interfere with beam propagation. The device can be used to capture radiation from sources which produce parallel or divergent radiation. The resulting beam or beams can be of a variety of shapes or angular orientations including quasi-parallel, convergent, and split beams. Energy filtering is accomplished by selective absorption of radiation by the channel-forming elements and by selective reflection, by geometrics which cause some energies to be discriminated against because of the angle of total external reflection associated with that energy.

69 Claims, 24 Drawing Sheets

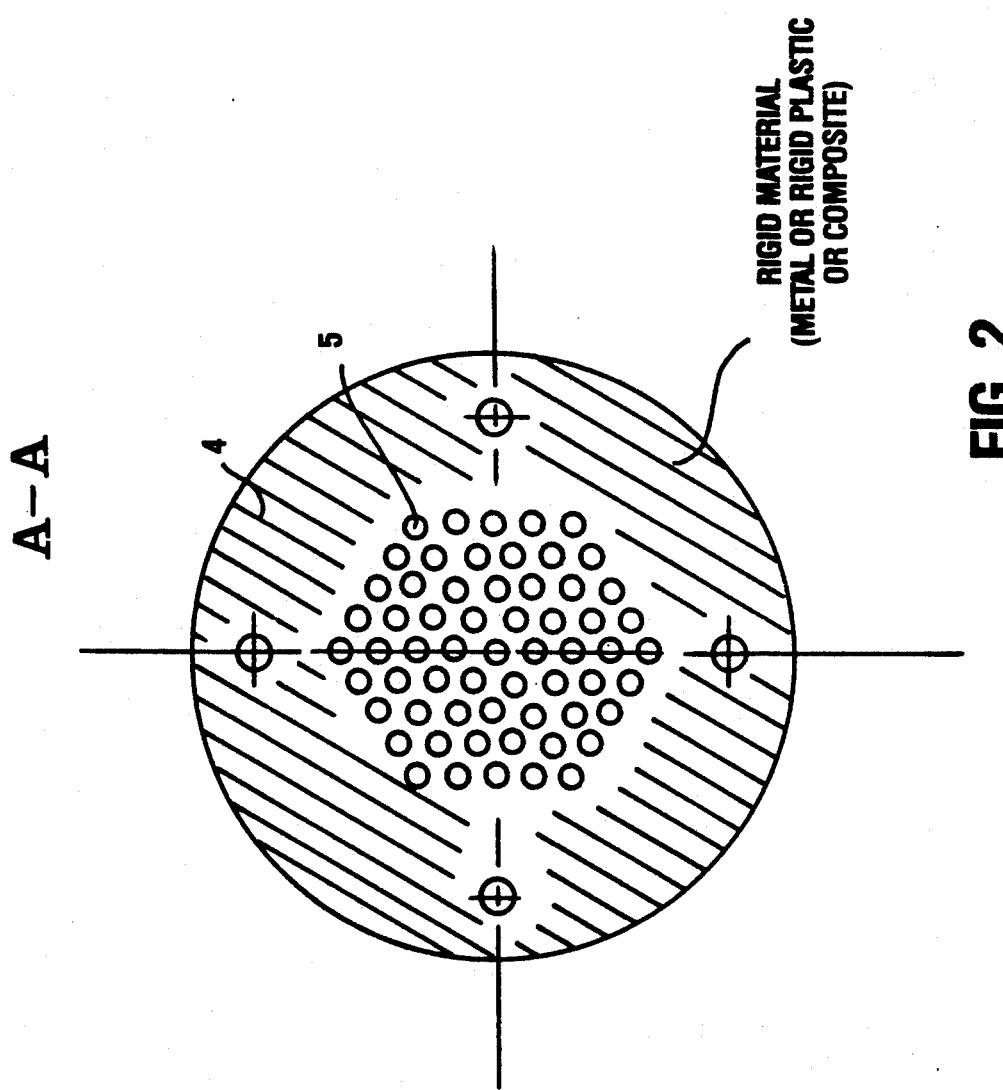

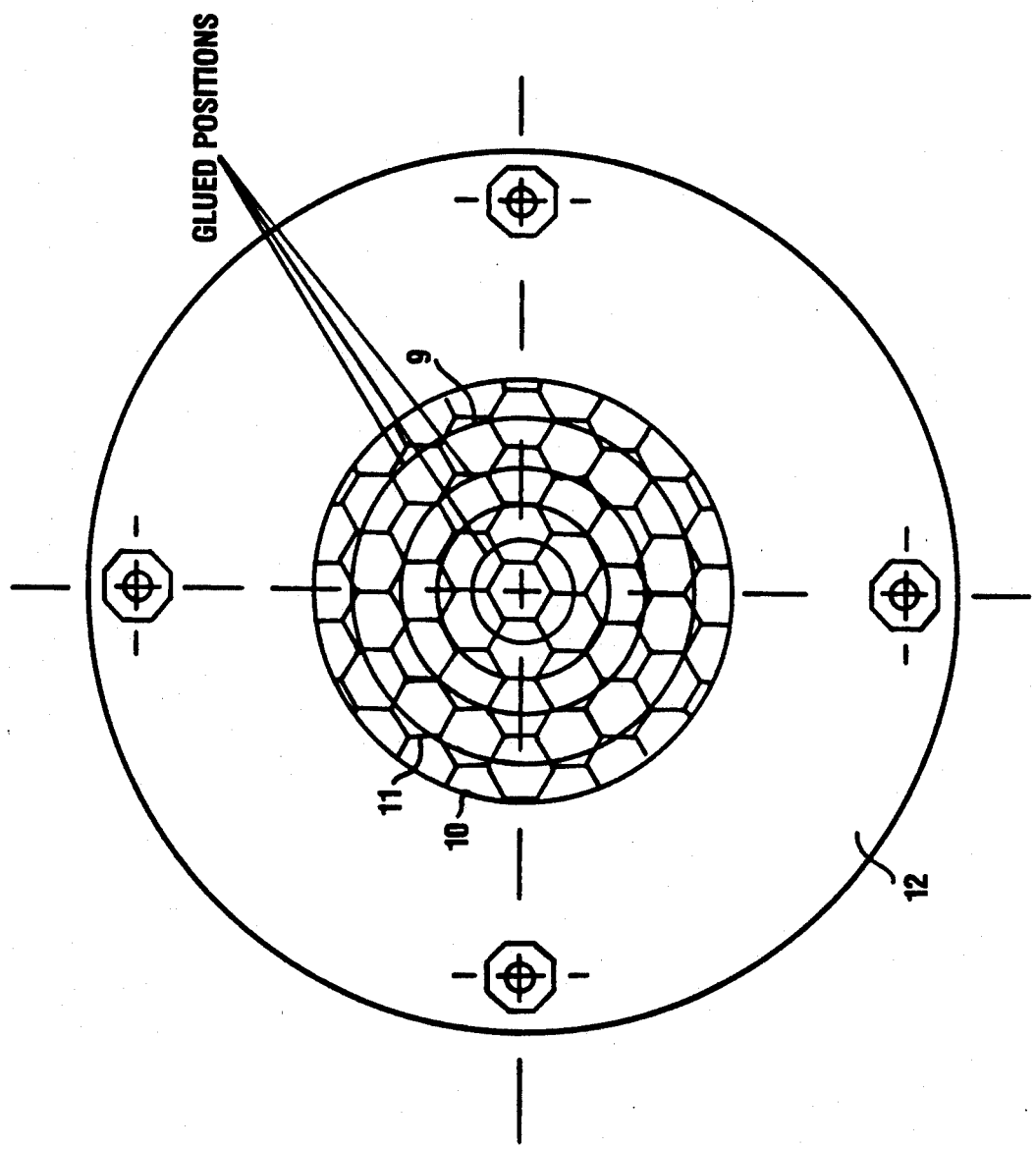

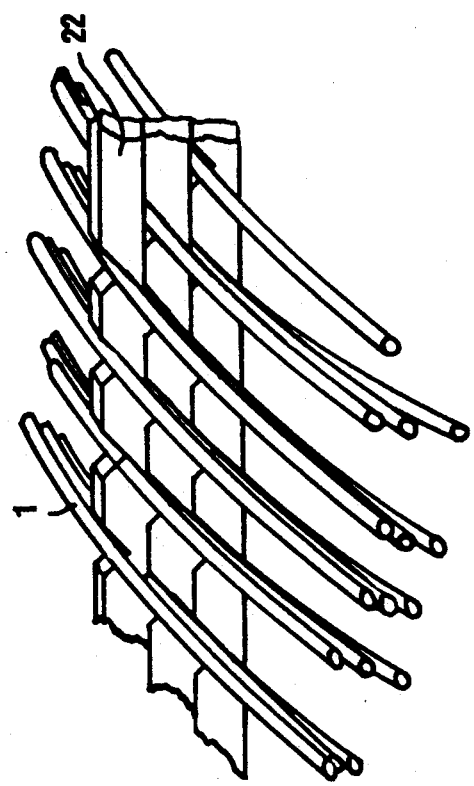
FIG. 9
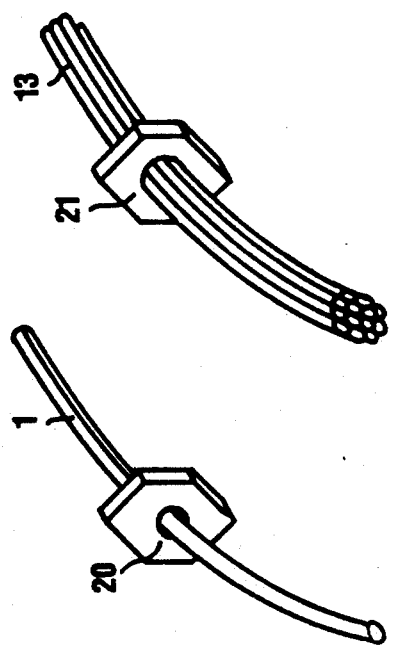
FIG. 8
FIG. 7

DEVICE FOR CONTROLLING BEAMS OF PARTICLES, X-RAY AND GAMMA QUANTA

This application is a continuation-in-part of application, Ser. No. 07/607,456 file Oct. 31, 1990, now abandoned.

FIELD OF THE INVENTION

This invention relates to devices for controlling radiation beams and, more specifically, to devices for controlling X-ray and gamma ray beams, and beams of charged particles and neutrons, and can be used to shape converging, diverging and quasi-parallel beams in a wide spectral range, at large aperture angles, and on short shaping paths.

The invention can, for example, be used to control X-ray, gamma and neutron beams in medical radiography and radiotherapy, to shape beams for X-ray microanalyzers and X-ray diffraction analyzers, and to improve the efficiency of gamma ray utilization in Mossbauer examinations.

A most advantageous application of this invention is to concentrate energy radiated by various sources with the objective of producing radiation beams with a high power density in a small area, e.g., to create oriented radiation detectors tuned to small size localized sources, for instance in radioastronomy.

BACKGROUND OF THE INVENTION

Various devices are used to control particle, X-ray and gamma ray beams; these devices are based on radiation interference and diffraction, for instance Fresnel microzone plates, multilayer mirrors, and Bragg crystals. Also used for charged particle beam control are magnetic and electrostatic elements. A critical shortcoming of these devices is their narrow spectral band, principally due to the physical phenomena on which they are based.

As is known, incidence of beams of various charged particles, neutrons, X-rays and gamma rays onto boundaries of condensed media, features a certain value of the grazing angle, called the critical angle of total external reflection, below which reflection is accompanied by very low losses. In the case of very smooth surfaces and low radiation absorption in the material of the reflective surface, the losses with total external reflection are so low that they allow efficient beam control via multiple reflections at angles below critical. Known in the art are devices functioning with multiple total external reflection in bent tube channels to concentrate and shape quasi-parallel beams of X-rays (Soviet Physics +Uspekhi, vol. 157, issue 3, Mar., 1989. V. A. Arkad'ev, A. I. Kolomijtsev, M. A. Kumakov, I. Yu, Ponomarev, I. A. Khodeyev, Yu. P. Chertov, I. M. Shakhparonov. "Wideband X-ray Optics With Wide-Angle Aperture", pp. 529–537).

This prior art device for controlling beams of X-ray and gamma quanta, charged particles and neutrons, comprises a plurality of channels with inner surfaces featuring total external reflection, with input butt-ends facing a radiation source, and with output butt-ends directed at a radiation receiver. The channel-forming elements are located on the generatrices of imaginary coaxial barrel-shaped surfaces, and can, for instance, be bent tubes with longitudinal axes positioned along said generatrices.

A shortcoming of this device is the considerable loss in radiation transfer efficiency along the tube channels, due to the inaccuracy of positioning of the tube channels along the generatrices of imaginary barrel-shaped surfaces and non-optimal orientation of the input and output butt-ends at the source and receiver of radiation, respectively. Another shortcoming is the device's relatively narrow spectral band which arises from non-optimal tube channel size. Attempting to optimize such prior art devices involves considerable engineering difficulties, inherent to the positioning of the particular channel-forming elements selected. These restrictions make device assembly a very labor consuming task and, in turn, place restrictions on the minimal channel size and possibility of reducing the beam control device dimensions, restrict the size of the minimal focal area and, thus, the efficiency of concentrating the radiation beam energy.

SUMMARY OF THE INVENTION

Accordingly, it is an object of this invention to improve the efficiency of radiation transfer along the channels of a beam control device.

Another object of the invention is to expand the angular and spectral bands of radiation beams being controlled.

Yet another object of the invention is to reduce the labor consumption of device manufacture, simplify its design and reduce its cost.

It is yet another object of this invention to reduce the overall dimensions of the device, reduce the size of its focal area, and correspondingly increase the efficiency of beam energy concentration and beam power density at the device output.

Furthermore, it is an object of this invention to improve radiation beam uniformity at the device output and reduce the angular beam divergence.

Also, it is an object of this invention to reduce the effects of background radiation on the radiation beams being shaped.

These and other objects are achieved, in a device for controlling beams of particles, X-ray and gamma quanta having a plurality of channels with inner surfaces exhibiting multiple total external reflections, with input butt-ends facing a source of radiation, and with output butt-ends aimed at a radiation receiver, and in which the channels are formed by elements positioned along the generatrices of imaginary barrel-shaped coaxial surfaces, in accordance with the principles of this invention, by spatially locating the channel-forming elements with a rigid support structure, and by providing each channel with a channel width, D, in the radial direction at the input butt-end, meeting the condition:

$$D_1 \leq 2\theta_D F + D$$

where $D_1$ is the effective radiation source diameter from which radiation is captured by the lens, $\theta_D$ is the minimum value of the critical total external reflection angle of the radiation in the desired spectral band, and F is the distance from the radiation source to the channel input butt-end, as measured along a central axis of beam propagation.

In the case where the plurality of channels comprise bent tubes with longitudinal axes located along the generatrices of imaginary coaxial barrel-shaped surfaces, it is advantageous to implement the rigid support structure of the present invention with discs positioned normal to the central axis of beam propagation, and to provide each disc with a honeycomb pattern of apertures accommodating the tubes, thus, rigidly fixing the latter along generatrices of barrel-shaped surfaces.

These rigid supports can take a number of forms, including solid plates with holes formed by processes such as lithography or laser machining, or a solid frame with wires or other items in patterns across the large opening at predetermined spacings along two or more directions in the plane, producing a grid.

This approach ensures a high accuracy of the bent channel shape, its rigid location, minimal deviation of the curvature radius from its optimal value, and accurate and rigid aiming of the input and output butt-ends at the radiation source and receiver, respectively, thus providing maximal capture of the radiation into the channels and radiation transfer with minimal losses.

In another aspect of the invention, individual one(s) of the discs may be made axially translatable relative to the other discs. This approach when applied, for example, to a disc nearest the input butt-ends provides adjustability of focal length and capture angle. Translatable supports are useful as well, for the ability to tune the transmission energy bandwidth and spectrum, and to adjust the beams focal spot size and exit focal length.

In cases where the channels are formed by gaps between coaxial barrel-shaped beam reflective layers or envelopes, coaxial to the beam being controlled, the rigid support structure may comprise at least two rigid grids (of, for example, honeycomb pattern) positioned at the input and output butt-ends of the channels, normal to the beam axis, with the envelopes rigidly fitted to the grids by their butt-ends. The advantage of such a design is minimization of radiation intensity losses in the device's fixing structure, simplification of device assembly, lower weight of envelope reinforcement, and minimization of envelope deformation by the reinforcing structure.

In embodiments employing bent tubes as the channel-forming elements, it is advantageous to position supporting discs with honeycomb patterns of apertures fixing the location of the bent tubes along the central axis of the controlled beam with a spacing of supports of $L \leq \sqrt{12EI/(QR_1)}$, where E is the tube elasticity modulus at the maximum temperature the tubes will experience including possibly elevated temperatures due to radiation absorptions, I is the moment of inertia of the cross section of the tubes relative to the neutral axis, Q is the tube mass per unit length, and $R_1 = 2D/Q^2$ is the critical tube curvature radius, as determined by the high-energy boundary of the required radiation spectrum. This minimizes tubes sagging under their own weight to an allowable curvature, at which the radiation intensity losses during radiation transfer along the channels is not excessive.

In the event that the plurality of channels is designed as capillaries, it is another feature of this invention to group these latter into separate bundles with the longitudinal axes of the bundles positioned along generatrices of imaginary coaxial barrel-shaped surfaces, coaxial to the controlled beam's central axis, and to design the rigid support structure as discs positioned normal to the controlled beam axis and provided with honeycomb patterns of apertures to accommodate each of the capillary bundles. This design configuration is advantageous in that it allows expansion of the spectral band of the device due to a smaller diameter of the channels and a greater number of channels, whereas the labor content of assembling depends on the number of capillary bundles, rather than on the number of channels. It also reduces breakage due to the strength of the bundles compared to the strength of small individual capillaries.

The device dimensions can also be reduced due to a lower critical curvature radius $R_1$ of the channels.

In the case mentioned earlier, with the plurality of channels designed in the form of bent tubes with longitudinal axes located along generatrices of imaginary barrel-shaped surfaces coaxial to the central axis of the controlled beam, it is also possible, in accordance with the principles of the present invention, to form the rigid honeycomb pattern support structure out of the tube walls, rigidly linked by their external surfaces, making the channel width in each tube variable along the channel length and proportional to the corresponding dimension of the device at each cross section of the latter. This embodiment provides the advantage that the entire device can be formed by plastically deforming a bundle of tubes to have a larger channel size in the wide part of the device and making the channel diameter very small at the butt-ends oriented at the focal point. This can be done by methods such as drawing thermoplastically heated tube bundles. This approach allows reducing of the diameter of the focal area by several orders of magnitude, thus, correspondingly increasing radiation energy concentration. Once automated, this method will serve as a low cost method for manufacturing the invention.

In another aspect of the present invention, where the plurality of channels comprise bent tubes having their longitudinal axes positioned along the generatrices of imaginary coaxial barrel-shaped surfaces, it is expedient to compose the rigid honeycomb pattern support structure of bushings encompassing each tube in a plane normal to the central axis of beam propagation, with the bushings rigidly fitted to one another to constitute a support with the aid of adhesive or interlocking mechanisms, or clamping devices (e.g., an outer band). This significantly simplifies assembling of the device and allows creation of devices with a substantially greater number of channel-forming elements, thus expanding the range of angular beam control.

Similarly, it is also expedient, in the case where the plurality of channels are designed with capillaries, these latter being grouped into bundles with the longitudinal axes thereof positioned along the generatrices of imaginary coaxial barrel-shaped surfaces, to compose the rigid honeycomb pattern support structure of bushings encompassing each capillary bundle in a plane normal to the controlled beam axis and rigidly fitted to one another by adhesive or interlocking mechanisms or clamping devices. This allows simplifying the device assembly.

Instead of bushings surrounding each tube or bundle of capillaries, coplanar stacked cradles can be employed to form the rigid support structure.

The rigid support structure may be mounted for rotation, as a unit, around the central axis of beam propagation, thus allowing equalization of time-averaged radiation intensity along the beam cross section by averaging irregularities caused by beam transfer via separate channels.

According to yet another aspect of this invention, it is suitable to have different length for different channels, selecting the lengths thereof in accordance with the required attenuation o the radiation intensity in each area of the cross section of the beam being shaped. This allows control of the radiation intensity along the cross section of the beam being shaped by canceling out irregularities caused by different intensity losses during radiation transfer via channels of different curvature. The most common use is to equalize beam intensity. Alternatively, an absorbing filter with a density or thickness varying over the cross sections; the most common use being a filter with absorptions falling off from its center to its periphery can be positioned in the beam path to accomplish the same purpose.

It has further proven advantageous to make the individual elements diverging (e.g. conically diverging) with a taper angle $\theta_1 < \theta - D/L_1$, where $\theta$ is the required divergence angle of the quasi-parallel beam, and $L_1$ is the length of the tapered tube section. In this case, radiation transfer in the flared out channels is accompanied by beam divergence reduction to the value of the taper angle.

In another aspect of the invention, the channel forming elements can be located along generatrices of imaginary coaxial surfaces of compound curvature. For instance, the output butt-ends of channels may be extended with channel-forming elements located along the generatrices of imaginary toroidal surfaces matched to corresponding ones of said barrel-shaped surfaces, with the output butt-ends oriented at the radiation receiver. This allows providing a higher density of radiation beams thus shaped.

It is productionally effective to create the rigid support structure by filling the gaps between tubes with a compound. It is also suitable to provide the device with an external screening casing of a material opaque to the radiation of the controlled beam, with apertures in the casing aligned with the channel butt-ends, and employing only curved channels and radiation absorbing intertube material in order to block any straight line paths to an enclosed radiation receiver or source, thus reducing the share of background radiation in the radiation beams shaped. Such filling also reduces the susceptibility of the device to movement such as vibrations.

BRIEF DESCRIPTION OF THE FIGURES

These and other objects, features, aspects and advantages of the invention will become more readily apparent from the following detailed description of specific embodiments thereof, when read in conjunction with the accompanying drawings, in which:

FIG. 2 shows a section of the embodiment shown in FIG. 1 along the A—A plane;

FIG. 5 shows a view of the embodiment shown in FIG. 4 from the radiation source side;

FIG. 7 depicts the use of a bushing encompassing a bent tube to form a rigid supporting structure;

FIG. 8 depicts the use of a bushing surrounding a bundle of capillaries to form a rigid supporting yoke;

FIG. 9 illustrates a rigid support structure composed of stacked cradle members;

DETAILED DESCRIPTION OF THE INVENTION

Figure 1:
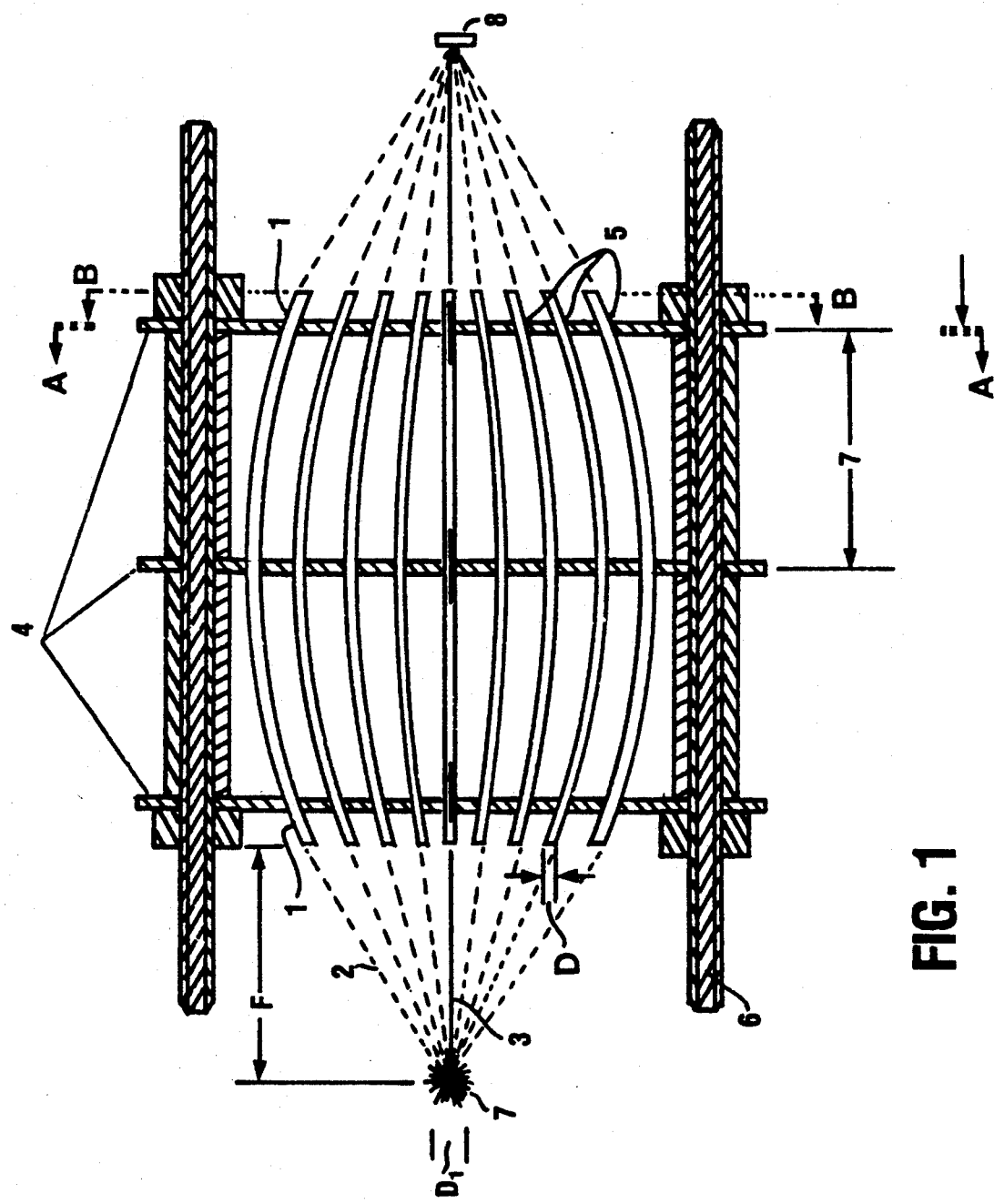
FIG. 1 shows a section along the controlled beam axis of an embodiment of the invention with tubes as the channel-forming elements fixed in place by discs having apertures positioned in a honeycomb pattern.

The device (also referred to as a Kumakhov lens) for controlling beams of particles, X-ray and gamma quanta, comprises a plurality of channels with inner surfaces featuring multiple total external reflections. In the embodiment of FIG. 1, the channel-forming elements are bent hollow tubes 1. The longitudinal axes 2 of tubes 1 are located along the generatrices of imaginary barrel-shaped surfaces coaxial to central axis 3 of the controlled beam. The channel-forming elements are rigidly linked to one another by a rigid support structure.

The rigid structure includes discs 4 positioned normal to axis 3 of the controlled beam. These discs are each provided with a honeycomb pattern of apertures 5, for receiving and supporting tubes 1 therein. In the honeycomb pattern, as shown in FIG. 2, each aperture is surrounded by six equally spaced nearest apertures, except for those apertures on the perimeter of the pattern. Other arrangements of apertures are possible, but this is preferred for most applications. The inter-aperture spacing on each disc 4 depends upon the intended axial position of the disc and is chosen so as to rigidly fix the positions of tubes 1 (FIG. 1) along the generatrices of barrel-shaped surfaces. Discs 4, which are made of rigid material (e.g. metal or rigid plastic or composite), are rigidly linked to one another by frame 6.

Figure 3:
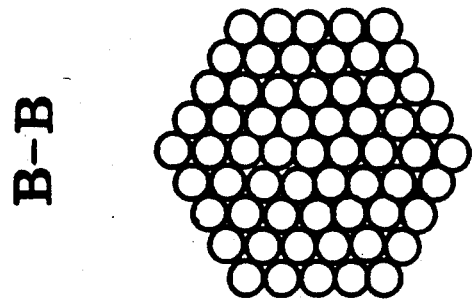
FIG. 3 shows a cross sectional view of the embodiment of FIG. 1 along the B—B plane in a case where the capillaries are extended until they touch.

The input butt-ends of bent tubes 1 face radiation source 7, and the output butt-ends are oriented at radiation receiver 8. Both sets of butt-ends are preferably arranged in hexagonal close packed formation, as illustrated in FIG. 3.

Referring again to FIG. 1, in accordance with the present invention, the radial width D of each channel (the diameter of tube 1 at the input butt-end) is defined as:

$$D_1 \leq 2\theta_D F + D$$

where $D_1$ is the effective diameter of radiation source 7; $\theta_D$ is the minimum critical angle of total external reflection in the spectral band specified; and F is the distance from radiation source 7 to the input butt-end of tubes 1 measured along central axis 3.

Figure 4:
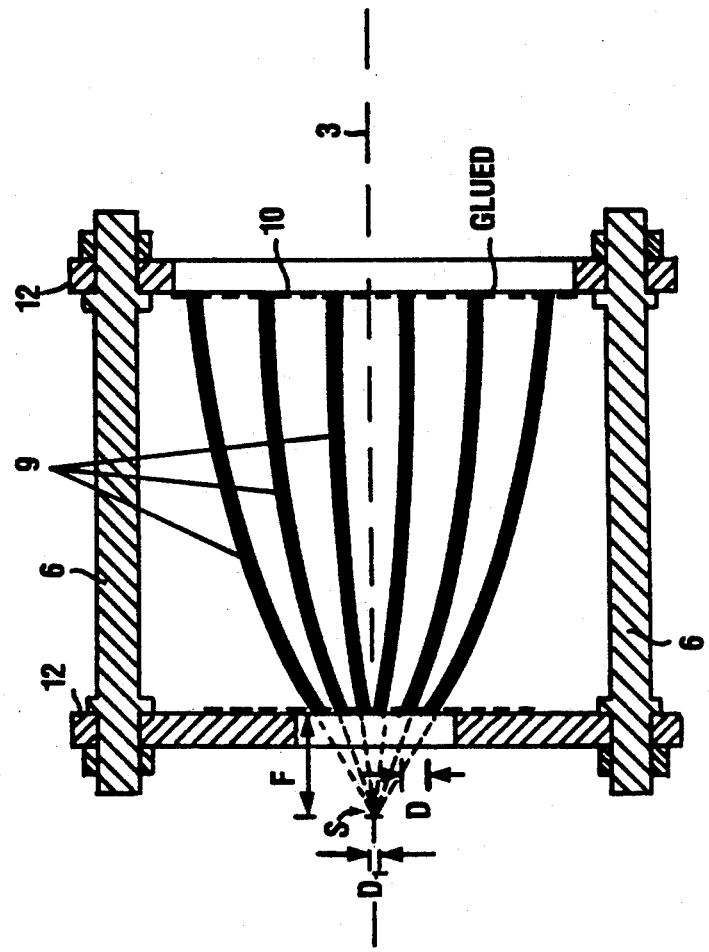
FIG. 4 shows a section along the controlled beam axis of an embodiment of this invention with barrel-shaped envelopes as the channel-forming elements, fixed in place by gluing to honeycomb grids.

FIG. 4 depicts another embodiment of the present invention, wherein channels are formed by gaps between barrel-shaped beam reflective layers or envelopes 9, coaxial to the controlled beam axis 3. The rigid support structure comprises at least two grids 10 having, for example, honeycomb arrays of cells 11 (FIG. 5), positioned at the input and output butt-ends of the channels normal to controlled radiation beam axis 3. The rigid support member can be in shapes other than honeycomb, but should be carefully chosen as the blocked conditions can form an undesirable pattern in the beam. Envelopes 9 are rigidly fixed in space by being fitted to grids 10 by their butt-ends (for instance, by gluing), and grids 10 are fitted to support rings 12 which, in turn, are rigidly linked to one another by frame 6, as shown in FIG. 4.

The radial width D of each channel in this embodiment is defined by the distance between two adjacent envelopes in the radial direction at the butt-end plane, as shown in FIG. 4.

Referring again now to embodiments in which bent tubes serve as the channel forming elements, to improve the filling factor of the input cross section by tube 1 (FIG. 1) channels, the cross section of each of tubes 1 can advantageously be made triangular, rectangular, hexagonal or of other shape at which the filling factor of the device input cross section is maximal. The rigid support member may be in a shape other than honeycomb, but should be carefully chosen since blocked radiation can form an undesirable pattern in the beam.

With uniformly bent tubes 1 with a channel of D size, even an originally parallel radiation beam injected into tube 1 is incident on the channel walls at angles ranging from zero to $\theta_{max}$, where $\theta_{max} = (2D/R)^{\frac{1}{2}}$, R being the radius of tube 1 bend, so that each specific type and energy level of radiation features a so-called critical bending radius $R_1 = 2D/\theta^2_D$, below which the capture efficiency falls off proportional to $R/R_1$.

In case of rectangular channels, this decay is linear; with cylindrical channels it follows a more complex law. In beam control devices local bends due to tube sagging under their own weight should be limited to $R > R_1$.

It is preferable to position discs 4 with honeycomb pattern located apertures 5 fixing bent tubes 1 along the controlled beam axis 3 with a spacing of supports of $L \leq (12EI/QU_1)^{\frac{1}{2}}$, where E is the elastic modulus of tubes 1, I is the moment of inertia of tube cross section relative to its neutral axis, Q is tube weight per unit length and $R_1$ is the critical bend radius of tubes 1, as defined by the high-energy boundary of the radiation. With such a positioning of discs 4, additional bending of tubes 1 under their own weight will not exceed a value required to retain total filling of the channels of tubes 1 by the radiation being transferred.

Expansion of the operating spectral range of devices of this invention and their application to control neutron beams are related to the reduced critical angle of total external reflection and, correspondingly, to the necessity of reducing the diameter of tubes 1. At tube diameters below 100 μm, device assembly procedures become rather complicated.

Figure 6:
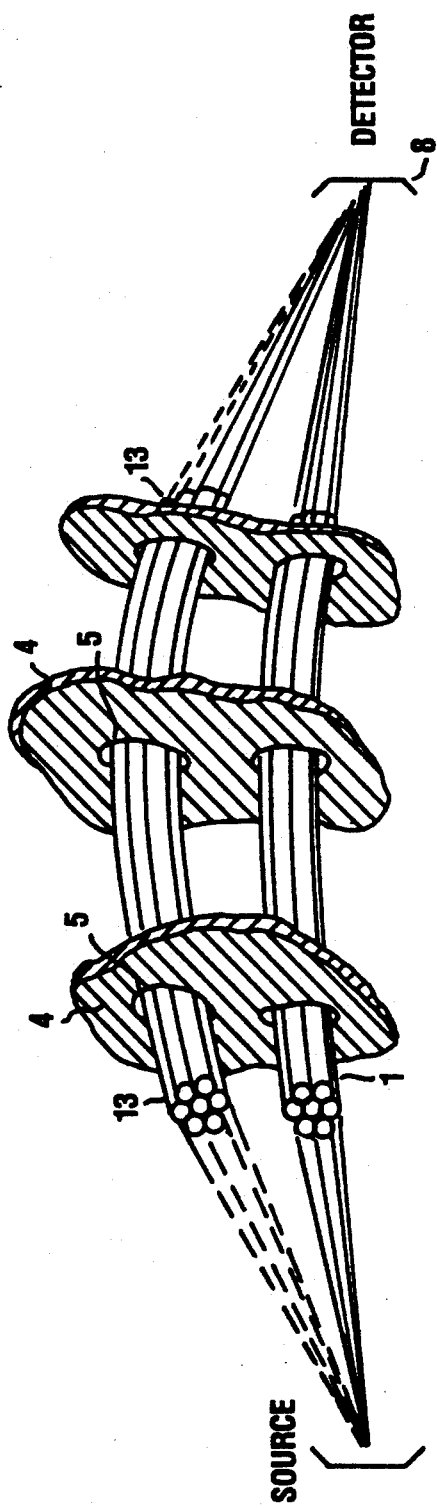
FIG. 6 shows part of an embodiment of this invention with capillaries grouped into separate bundles as the channel-forming elements.
Figure 27:
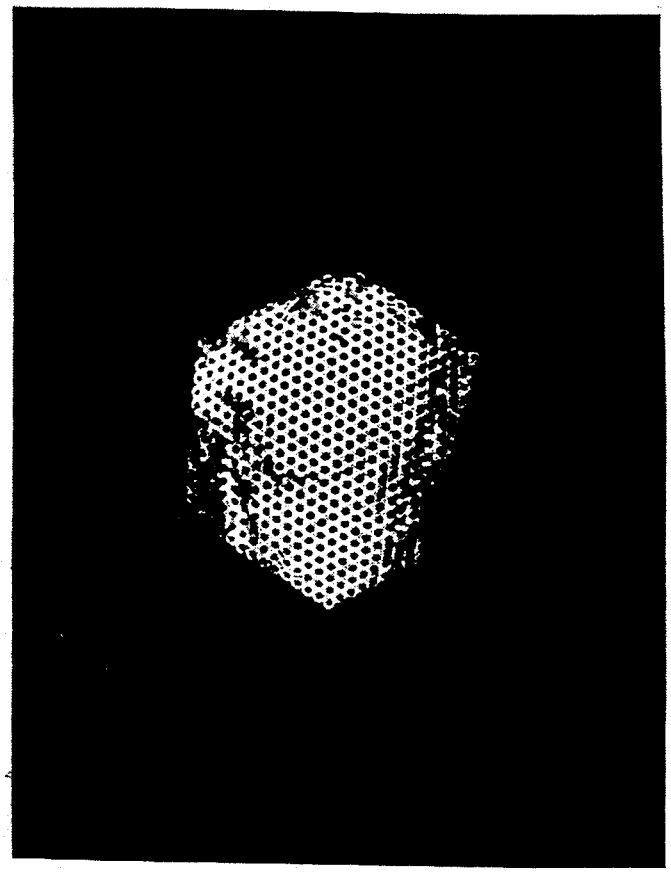
FIG. 27 shows a poly-capillary having a 300 $\mu$m diameter with each individual channel having a diameter of about 10 $\mu$m.

In the case of tubular channel-forming elements, it is advantageous to fabricate each tube 1 as a plurality of interconnected capillaries 13, with a smooth reflecting surface providing multiple total external reflections (FIG. 6 and FIG. 27). With this construction, the effective channel diameter can be reduced by several orders of magnitude. This facilitates operating spectral band expansion to the region of higher energies, and allows smaller bend radii of tubes 1 due to critical bend radius being here determined by the diameter of capillary channels 13, rather than by that of tube 1. Thus, the channel diameter may be reduced to sub-micron dimensions and the number of channels enlarged by several orders of magnitude, whereas the labor consumption of assembling the device is determined by the number of such multi-capillary tubes and is, therefore, retained at the level of the original tubular design.

In embodiments where the plurality of channels is designed with bent tubes 1 (FIG. 1), with the longitudinal axes thereof positioned along generatrices of imaginary coaxial barrel-shaped surfaces, the rigid honeycomb structure may be implemented with bushings 20 encompassing each bent tube 1 in a plane normal to the controlled beam axis, as depicted in FIG. 7. The bushings are rigidly linked to one another such as by adhesive or interlocking mechanisms, or clamping mechanisms.

Similarly, where the plurality of channels is embodied with capillaries 13 (FIG. 6) grouped into separate bundles, the longitudinal axes of which are positioned along generatrices of imaginary coaxial barrel-shaped surfaces, the rigid honeycomb structure may be in the form of bushings 21 (FIG. 8) enclosing each bundle of capillaries 13 in a plane normal to the controlled beam axis. Again, with the bushings rigidly linked to one another such as with adhesive or a bandage brace to form a yoke.

Alternatively, tubes 1 (or bundles of capillaries 13) may be supported in desired position with rigidity secured stacked cradle members 22, as shown in FIG. 9.

Figure 10:
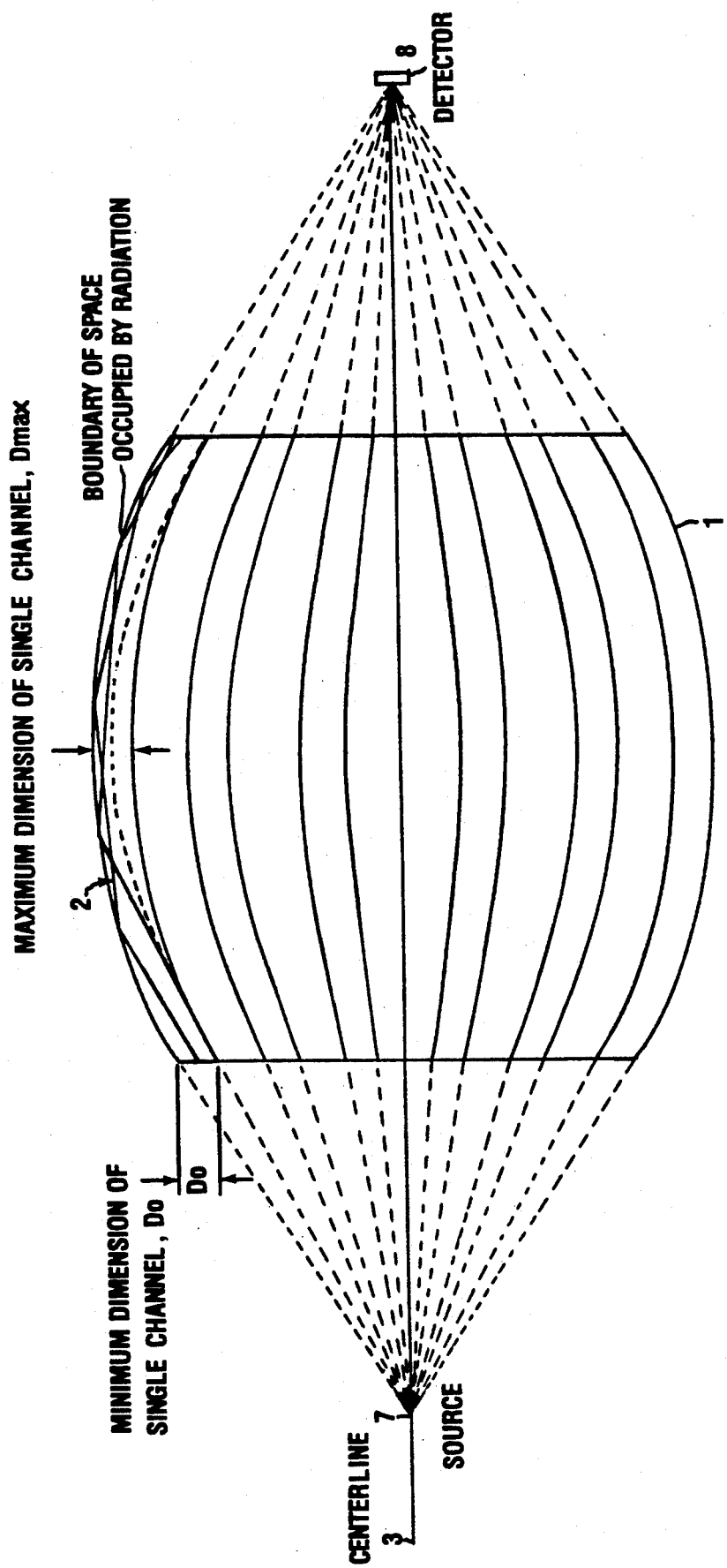
FIG. 10 shows a section along the controlled beam axis of an embodiment of this invention with channel-forming elements designed with tubes plastically shaped to produce varying channel cross sections, wherein the rigid honeycomb pattern support structure is formed by the walls of the tubes themselves.

In the case of tubular channels, when it is desired to simplify assembly procedures, reduce the channel diameter in tubes 1 to a practicable minimum, and reduce the size of the beam concentration area, thus increasing the beam density in this area, the rigid honeycomb structure may be formed by the walls of tubes 1 rigidly fitted to one another by their external surfaces. This invention envisions fabrication of such a device with thermoplastic tubes, such as glass tubes (FIG. 10). This provides a variable channel width along the tube length, from $D_o$ at tube 1 butt-ends to $D_{max}$ at their middle sections, in this embodiment proportional to the diameter of the corresponding given tube barrel-shaped surface in each cross section of the latter. Under these conditions, the critical bend radius of tubes 1 is defined by the input diameter $D_o$, because the incomplete filling of the channel cross section with the radiation being transferred between the device butt-ends is not critical in terms of transfer efficiency.

In the preferred embodiment depicted in FIG. 10, each tube 1 is bent along a curve approximating a circle arc, so that the radiation captured by its thin end at the device input is transferred via a flaring out and then, if necessary, tapering off channel by reflections from only a wall with positive Gaussian curvature and never arriving at the opposite wall, therefore retaining the range of grazing angles acquired at the device input till it arrives at the output, where, according to this invention, the diameter of tubes 1 is at least the input diameter $D_o$, because in the opposite case it becomes impossible to avoid reflections from the opposite wall, leading to additional radiation losses due to the grazing angle exceeding the critical angle $\theta_D$ a of total external reflections.

The device of this invention can be used to shape quasi-parallel radiation beams for such applications as long-haul energy transmission (for instance, data transmission), transmission of images of the objects being irradiated without geometric distortions and Bragg radiation monochromatization with the aid of planar crystals. In a number of cases (for instance, in X-ray lithography), the radiation beam is required to be highly homogeneous and highly parallel. However, quasi-parallel beams shaped by multiple total external reflections in tubular systems exhibit non-uniform radiation distribution across the beam cross section due to the discrete nature of radiation transfer via separate tubes 1 (microinhomogeneity), with intensity falling off from the beam center to its edges due to a lower efficiency of radiation transfer at a higher curvature of tubes 1 (macroinhomogeneity).

Figure 11:
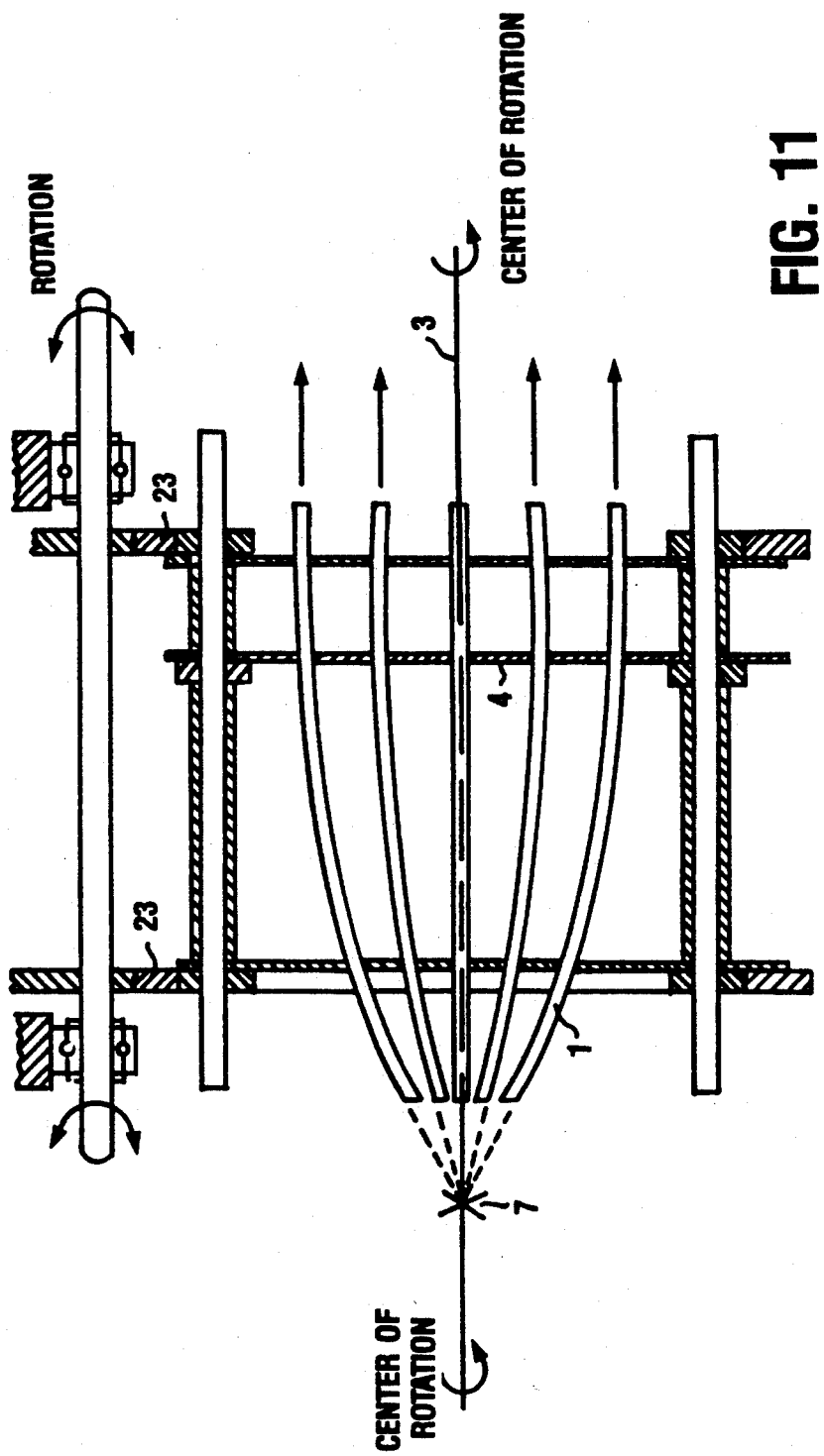
FIG. 11 depicts an arrangement for rotating a rigid channel supporting structure about a central beam axis.

In cases when the inhomogeneity of the beam caused by discrete radiation transfer via a plurality of channels is critical, the rigid honeycomb structure, according to this invention, may be mounted rotatable around the controlled beam axis 3, so that the beam intensity can be equalized by averaging over the exposure time. This rotation can be accomplished, for example, with an externally driven circumferential gear set 23 as shown in FIG. 11, and can be used to shape quasi-parallel beams, for instance in X-ray lithography applications.

Figure 12:
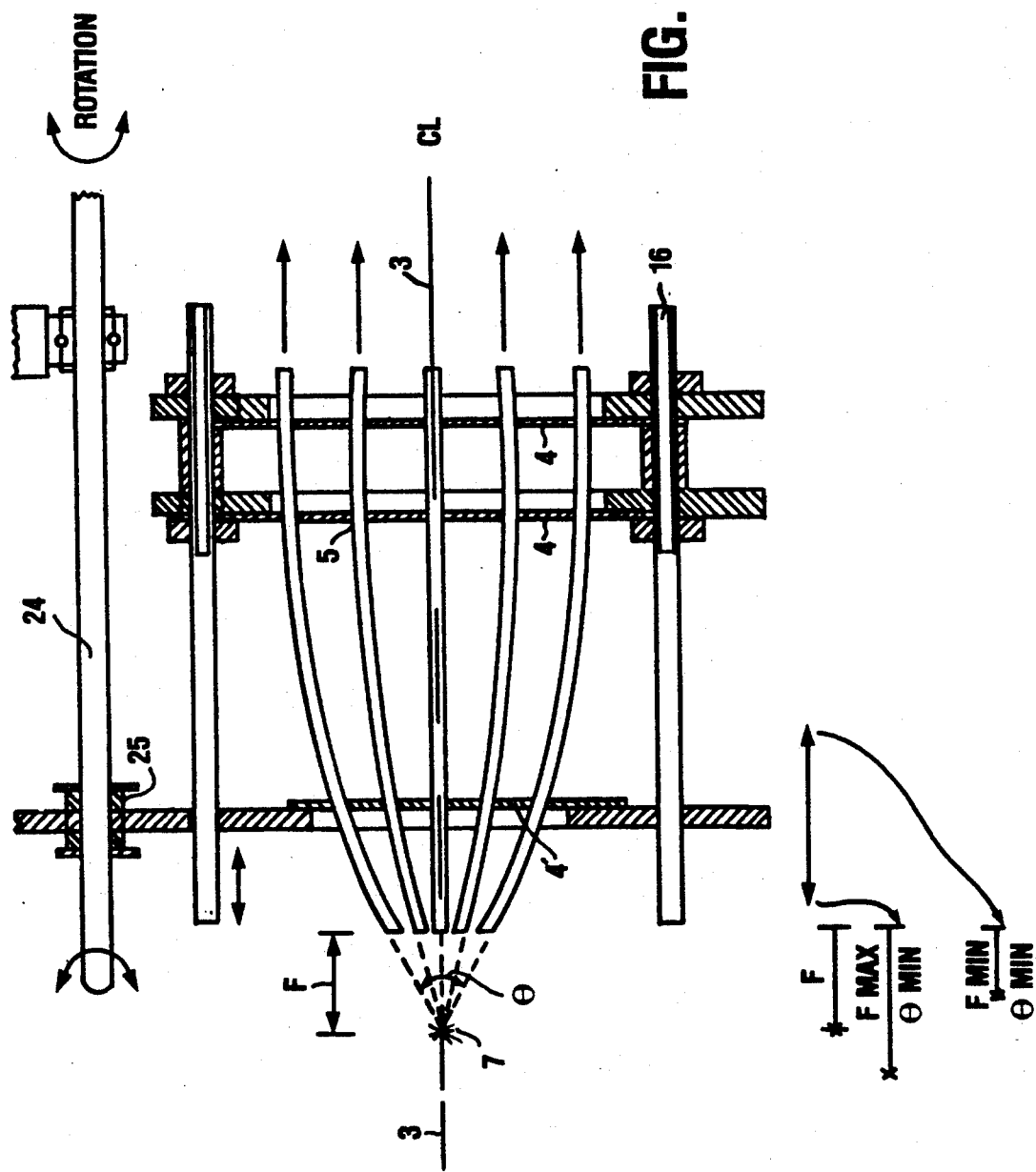
FIG. 12 shows an embodiment having an axially translatable support disc.

FIG. 12 illustrates an embodiment of the invention in which a support disc 4' near the input butt-ends of tubes 1 is axially translatable. A rod 24 acting through a worm gear mechanism 25 is employed to selectively translate disc 4' relative to stationary discs 4. Translation of disc 4' towards the input butt-ends serves to increase the focal length F and simultaneously decrease the capture angle $\theta$. Movement in the opposite direction has the converse effect. This construction also allows for tuning of the transmission energy bandwidth and spectrum.

Figure 13:
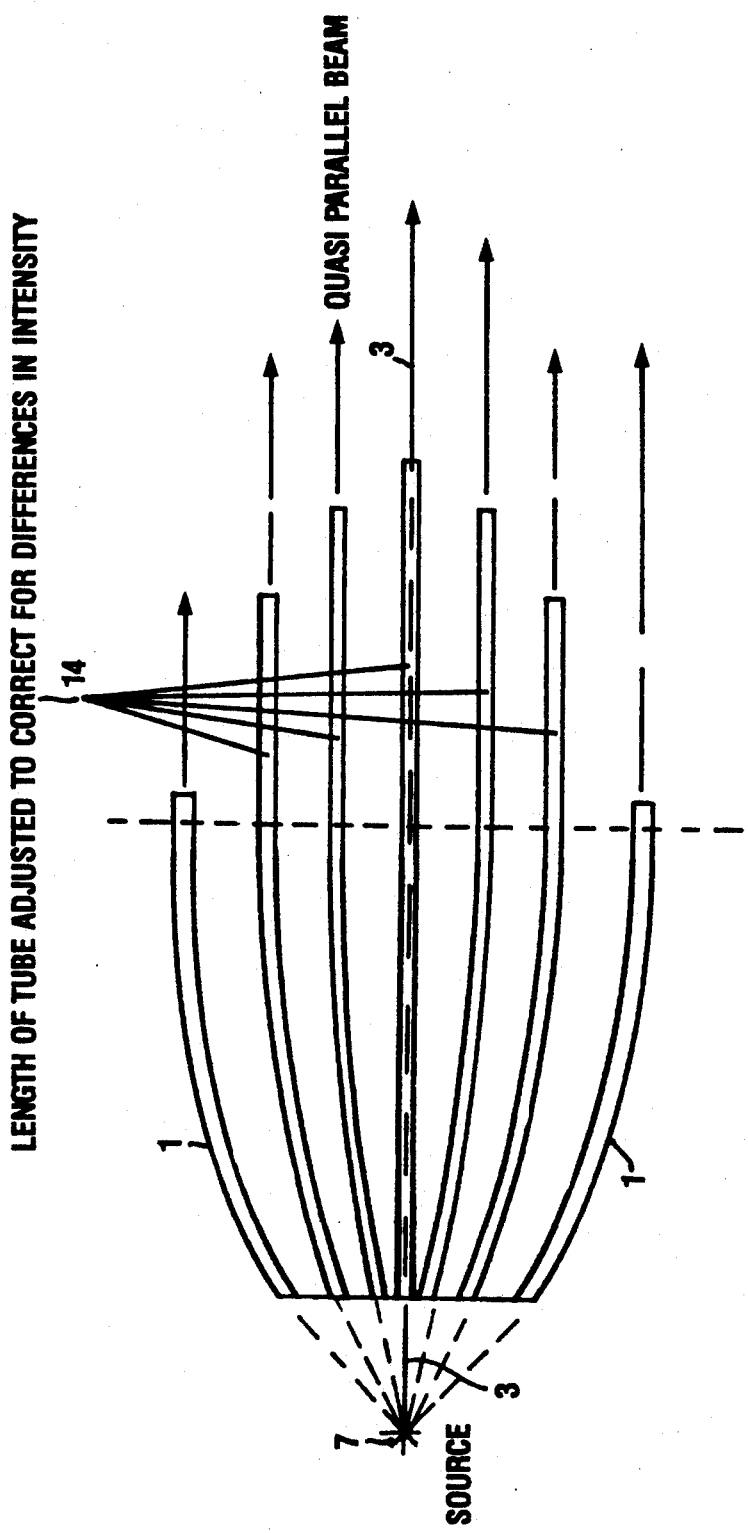
FIG. 13 shows a section along the controlled beam axis of an embodiment of this invention, wherein the channel-forming elements are tubes shaping a quasi-parallel beam, extended with rectilinear tube sections of different length to equalize the radiation intensity along the cross section of the quasi-parallel beam.
Figure 13A:
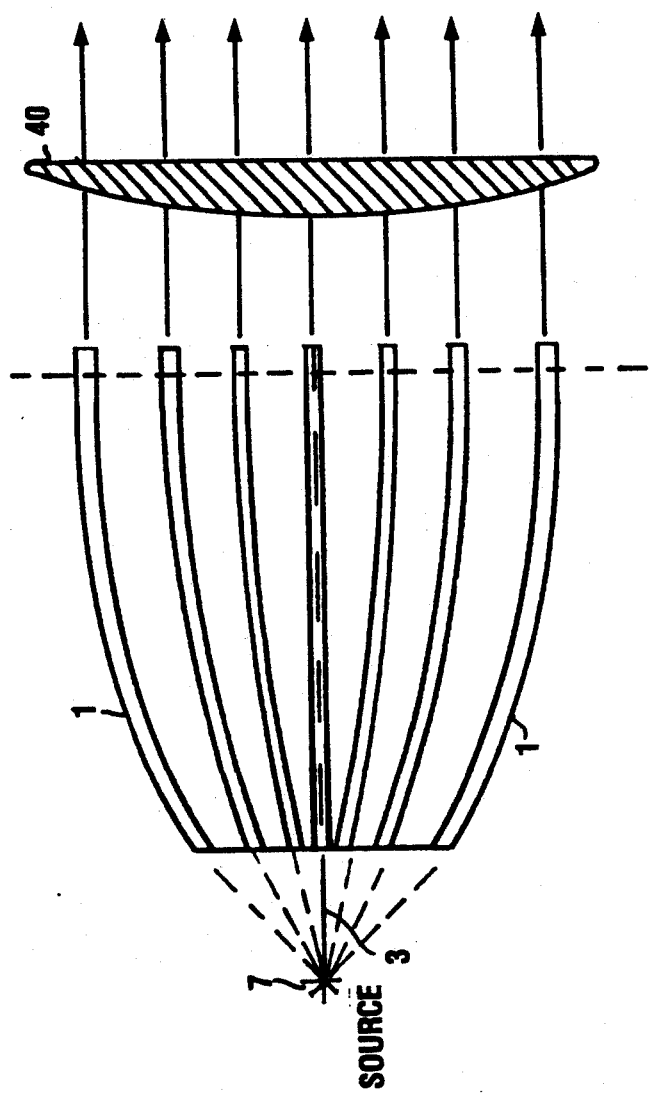
FIG. 13A shows a section along the controlled beam axis of an embodiment of the invention, in which an absorption filter is employed to equalize radiation intensity along the cross section of a quasi-parallel beam.

With longitudinal axes of tube 1 channels oriented parallel to one another at the output, output beam irregularities caused by radiation transfer efficiency variations due to beam travel via channels of different curvature may be smoothed out by extending the channel output butt-ends with rectilinear sections 14 (FIG. 13) of uniform cross section along their entire length. The lengths of the rectilinear sections 14 being selected according to the required attenuation of the beam intensity in each area of the shaped beam cross section. In this case a reduced intensity at the center of the quasi-parallel beam is provided by additional radiation absorption in elongated tubes 1. Tubes 1 butt-ends can also be distributed non-uniformly at the output with a pitch falling off from the center to the periphery in accordance with the required intensity distribution. Another possibility envisaged is positioning an absorbing filter 40 (FIG. 13a) in the beam path, with a density or thickness falling off from its center to its periphery in accordance with the original non-uniformity of the shaped beam. Such a filter can be produced, for instance, by lithography by exposing a resist, selected according to the type of radiation, to the shaped quasi-parallel beam.

Figure 14:
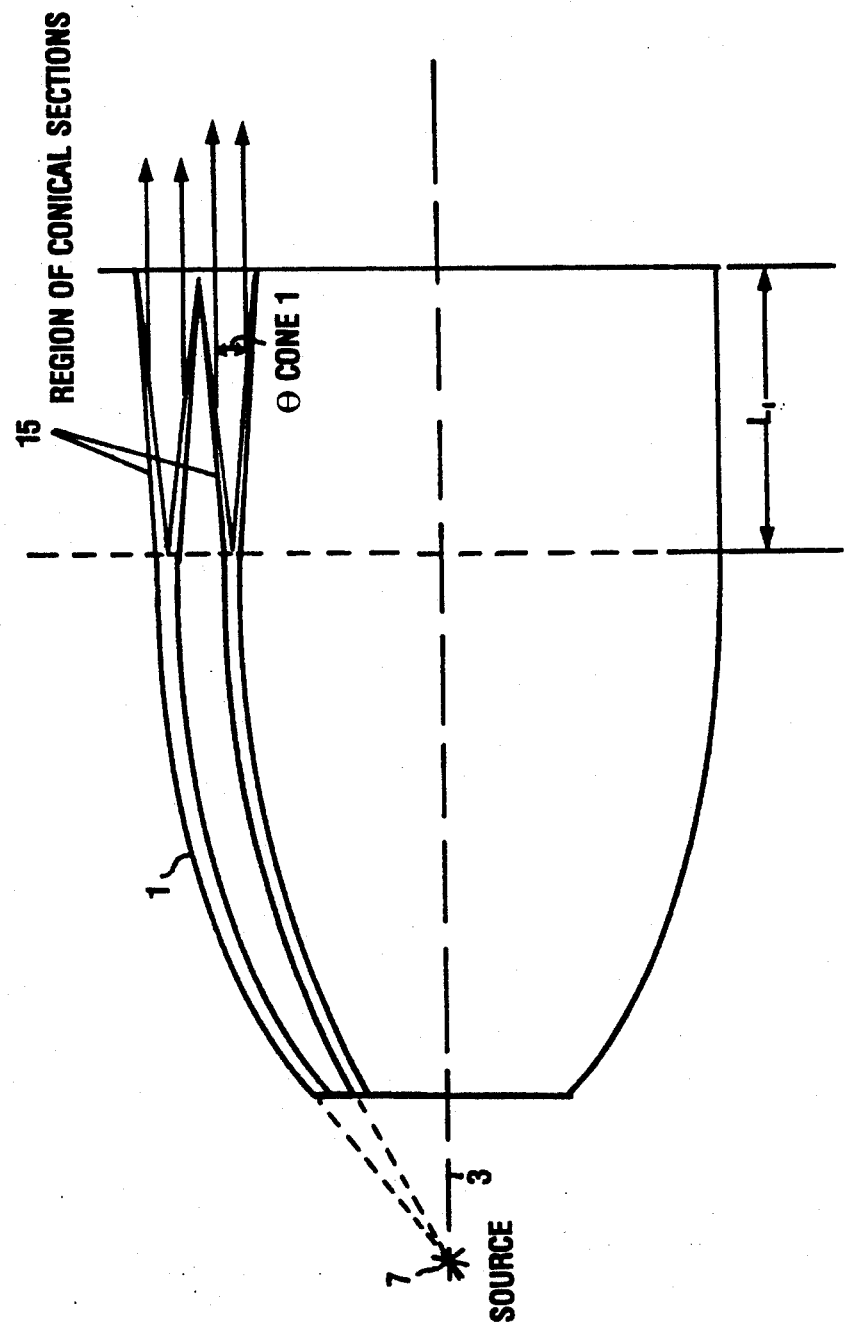
FIG. 14 shows a section along the controlled beam axis of an embodiment of the invention, wherein the channel-forming elements are tubes shaping a quasi-parallel beam, extended with flared tubes to reduce the divergence of the shaped quasi-parallel beam.

Divergence of the radiation from individual channels which are forming the shaped beam does not exceed the critical angle $\theta_D$ of total external reflection. If decreased divergence is necessary, this may be achieved by providing supplementary flaring out conical sections 15 (FIG. 14) of tubes 1 at the output, with the taper angle $\theta_1 < \theta - D/L_1$, where $\theta$ is the required divergence angle of the quasi-parallel beam and $L_1$ is the length of conical sections 15. Beam travel via a flaring out channel reduces beam divergence down to the taper angle.

Figure 15:
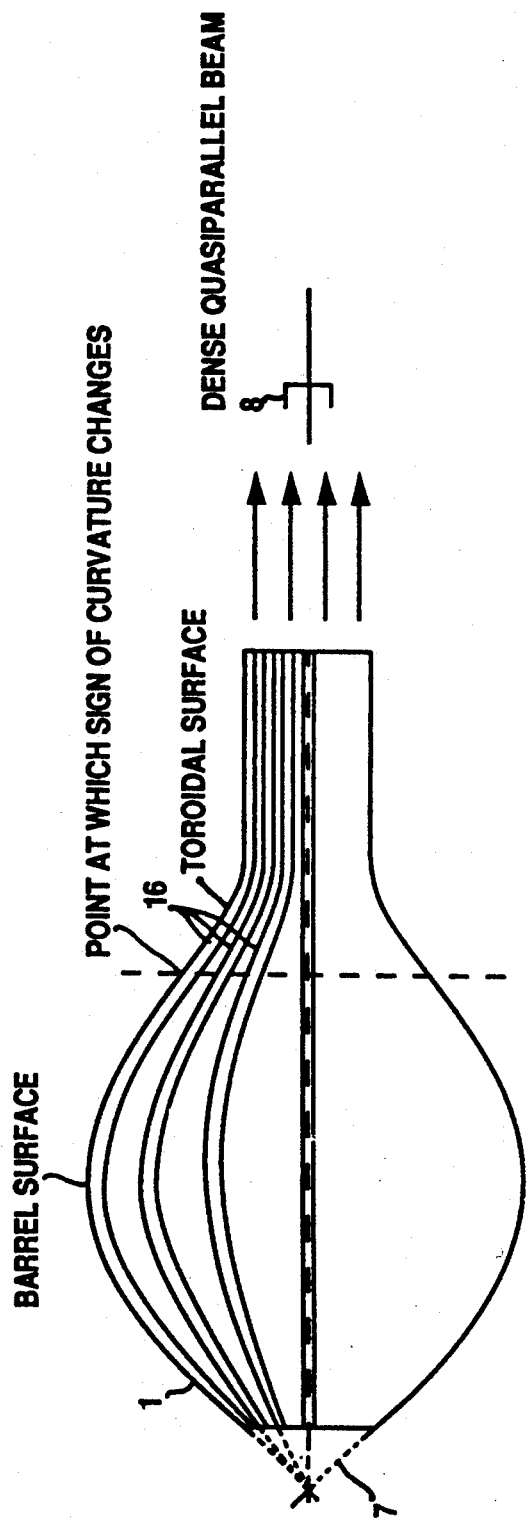
FIG. 15 shows a section along the controlled beam axis of an embodiment of the invention, wherein channel-forming elements located along generatrices of imaginary barrel-shaped surfaces are continued along generatrices of toroidal surfaces.

Using uniformly bent tubes 1 to shape quasi-parallel beams does not allow the output butt-ends of tubes 1 to be positioned with spacings, approximating those of the input butt-ends and, therefore, it is suitable to produce a quasi-parallel beam by extending the output butt-ends with sections 16 (FIG. 15) located along generatrices of imaginary toroidal surfaces, conjugate with the original barrel-shaped surfaces, and by orienting the output butt-ends of sections 16 at the radiation receiver. In this case, separate parts of the quasi-parallel beam are brought together, thus increasing the density of the output quasi-parallel radiation beam. The channel forming members may be located along generatrices of coaxial surfaces having other compound curvatures, if desired.

Figure 16:
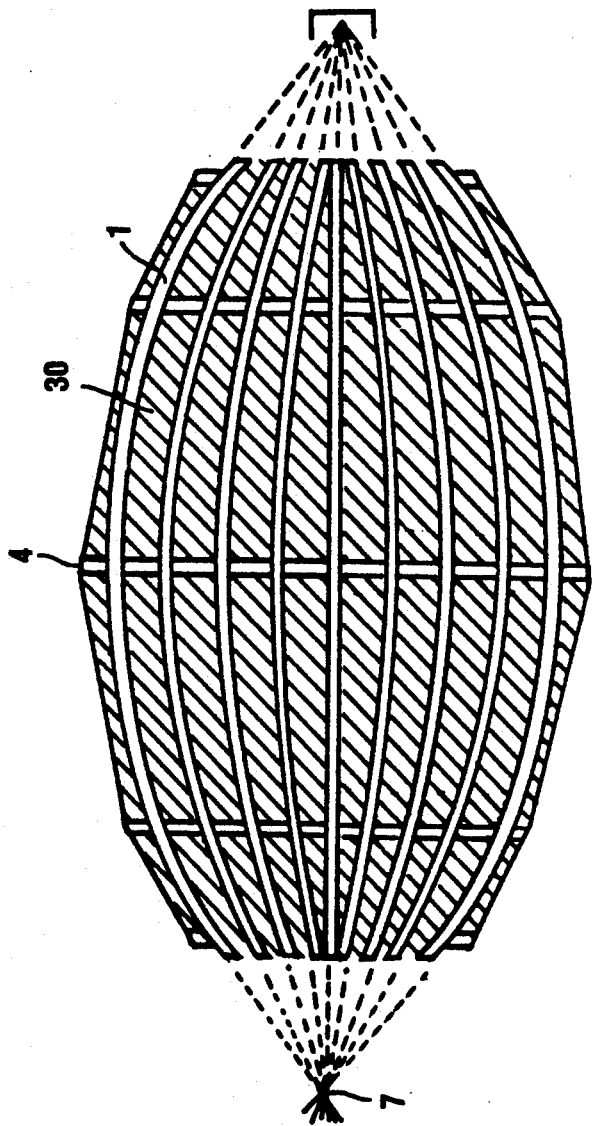
FIG. 16 shows a section along the controlled beam axis of an embodiment of the invention, wherein the gaps between channel forming tubes and between tube supporting discs are filled with a solidifying material.

Devices with tubular channels can be designed with a rigid honeycomb structure of solidifying material 30 (FIG. 16) filling the gaps between tubes 1 and between discs 4. In certain applications, it may be possible to remove discs 4 completely and simply rely on the solidifying material to provide the desired support for tubes 1. Such a design arrangement is suitable for devices with a large number of thin tubes 1, since it is simpler in assembly, for instance with a porous polymer used as the solidifying material to fix parallel positioned tubes and forming the barrel shape by compressing inside a barrel-shaped casing. This design configuration can be considerably lighter due to the absence of supporting superstructure, and this may be important, for instance, when designing X-ray telescopes for use in space.

Rigid and precise fixing of channel-forming elements, e.g. tubes 1 in discs 4 with honeycomb pattern positioned apertures 5, provides location of uniformly bent sections of channel-forming elements with a precise aiming of the channel input and output butt-ends at the source 7 and receiver 8 of the radiation, respectively. Meeting the condition $D_1 \leq 2\theta F + D$ ensures radiation incidence from any point of source 7 onto the channel walls at a grazing angle less than $\theta_D$, thus ensuring total external reflection of the radiation captured in the channel. A strictly fixed uniform bend of the channels facilitates retaining the radiation grazing angle relative to the channel walls and effective transfer of this radiation from the channel input to its output and its direction at radiation receiver 8.

It is proposed to concentrate parallel radiation beams with the aid of the herein above described quasi-parallel beam shapers by simply reversing the direction thereof, such that the previously described "output" butt-ends are aimed at the original parallel beam and the former "input" butt-ends are directed at the focal point.

Radiation monochromatization can be achieved by placing a crystal with planes at the Bragg angle relative to the quasi-parallel beam.

Figure 17:
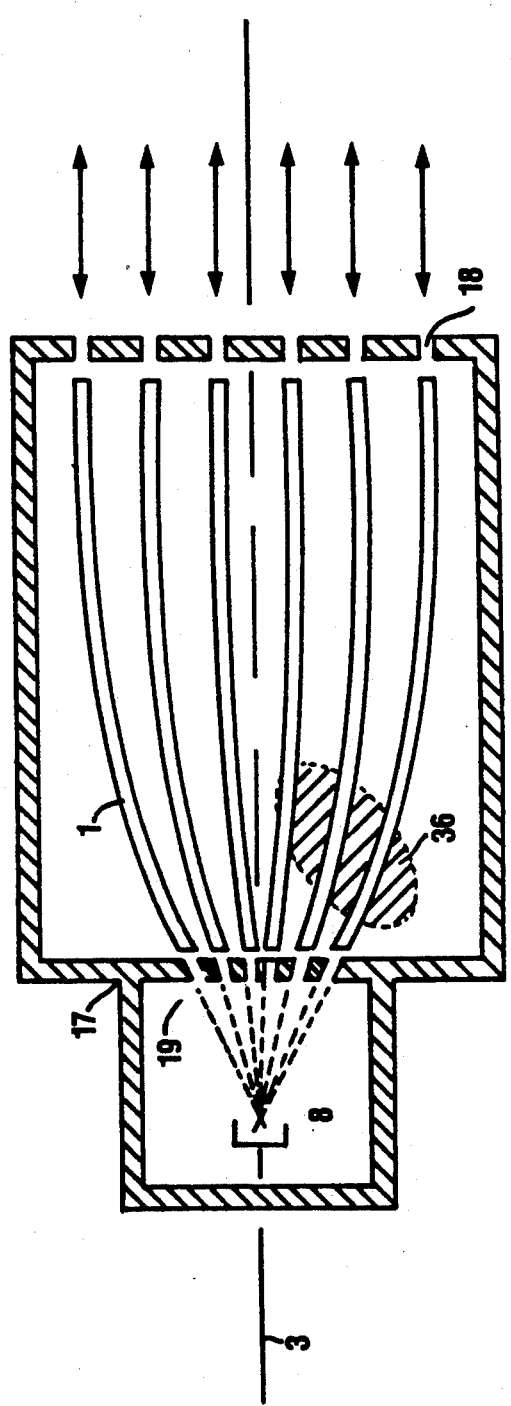
FIG. 17 shows a section along the controlled beam axis of an embodiment of the invention, wherein the entire device is enclosed in a screening casing having apertures aligned with the input and output butt-ends of the radiation transfer channels.

In case of inadmissible high background radiation it is preferable, as illustrated in FIG. 17, to enclose the entire beam controlling device (support structure not shown), along with the radiation receiver 8 (or source 7), inside an external screening casing 17 of a material opaque to the controlled radiation, with apertures 18 and 19 aligned with the axes of the channels at the input and output butt-ends, respectively. In this embodiment, the channel forming element along central axis 3 may be either omitted or blocked, and the gaps between tubes 1 filled with radiation absorbing or blocking material 36, so that no straight line paths to receiver 8 are available for transmission of unwanted background radiation.

The device for controlling beams of gamma and X-rays and particles is essentially a system of specifically oriented reflecting surfaces. Based on the total multiple internal reflections effect, the device allows transformation of diverging radiation from an isotropic source into a quasi-parallel beam, and also its focusing. The device may be designed as a bundle of bent glass tubes, or as a system or superimposed coaxial "barrel-shaped" reflecting surfaces.

The device provides control of gamma and X-ray radiation with the energy ranging from $1 \times 10^2$ eV to $1 \times 10^7$ eV, at radiation capture angles from an isotropic source ranging from a hundredth to several tens of degrees, depending on the radiation energy. The divergence of a quasi-parallel beam does not exceed the critical reflection angle, and can be as small as $10^{-4}$ radians. When used to focus the radiation, the concentration of gamma and X-rays or particles in the focal spot can be tens of thousands of times higher than would be the intensity at that position without the focusing optics.

The focal spot diameter is limited by the diameter of the focusing tubes and can be as small as $10^{-8}$ cm.

This device may be used to create qualitatively novel instruments for a wide range of scientific and engineering applications.

Embodiments employing a system of layers of bent tubes feature channels of identical length in a given layer with channel lengths in adjacent layers chosen to provide similar transmission characteristics. Furthermore, these X-ray waveguides and particle guides are oriented relative to the incident radiation, so that the beam grazing angle at the channel walls does not exceed the angle of total external reflection. The number of reflections of the beam from the guide increases with the distance from the beam central axis, resulting in the beam being turned by a wide angle. These features facilitate beam focusing and larger beam capture angles.

The device design is simplified and the accuracy of its assembling is improved by supplementing the system with discs (or other equivalent supporting structures), the apertures of which accommodate the tube radiation guides, with the distance between these discs and the lengths of the free radiation guide ends being subject to the previously described restrictive conditions.

Transition from the system designed with a bundle of radiation guides to a system comprising a plurality of superimposed second order surfaces separated by gaps provides a design, better adapted to streamlined production, with lower assembling and production labor requirements. Furthermore, this design allows producing focal spots of smaller size and reduces beam energy losses during radiation transmission via the system.

Making the system elongated and contracted at the side opposite to the radiation source, and ensuring that the tangent to the second order surface at the inflection point is at an angle less than the critical reflection angle allows the density of quasi-parallel beams to be substantially increased.

Such design embodiments of the device are equally effective in providing radiation beam control capabilities and can be used to design competitive instruments and equipment.

One of the most important sources of high-energy photons is a synchrotron. Synchrotron radiation is radiation emitted when charged particles are accelerated by deflection in a curved path. The energy of the radiation depends on the electron or positron energy and the radius of bending. In general, synchrotron sources are designed to produce radiation in the vacuum ultra violet range and X-ray range of the spectrum. Although the Kumakhov Lens can in principle operate with photon energy as low as 0.1 keV ($\lambda \sim 100$ Å), they are primarily designed for higher energy photons in the range from 0.5 to 1 Mev ($\lambda \sim 0.01$ Å). The Kumakhov lens also works with some types of particles, but the synchrotron is not a source of particles. The primary interest in this radiation source is the very high intensity and broad and continuous energy range possible. The X-ray intensity is determined by the number (current) of electrons (or positrons) circulating in the storage ring and the radius of curvature of the deflection. Both the photon intensity and energy are enhanced by the use of wigglers or undulators which cause the beam to oscillate in the vertical plane with a small amplitude and high frequency by the use of periodic magnetic electrostatic fields of alternating sign. The photon energy spread is continuous from very low energy (visible) up to a maximum.

The radiation from a synchrotron is in the form of a fan of photons from each sharp bend in the particle storage ring. The height of the fan is normally 0.5–2 mm. The width of the fan may be several degrees. For example, on the National Synchrotron Light Source the width of the fan at each position is 6 degrees—so from each port through a thin beryllium window emerges a fan of 6°×1 mm wide; highly parallel in the vertical direction—divergent in the horizontal direction. In order to use this radiation as efficiently as possible—several beam lines are crowded into this narrow angular range, each capturing a degree or so of the radiation fan. The limitation in use of the radiation is often physical space to allow the beam monochromators, deflection mirrors, and equipment to exist within the 6° wedge. To gain space, the beam lines often become very long—with resultant decrease of beam intensity because of the horizontal divergence.

A non-coaxial lens may be used with point sources and coaxial lenses and non-coaxial lenses used with parallel sources (e.g., a synchrotron), quasi-parallel sources, and extended sources, together with the sources, stated above. However, this technology is in no way limited to coaxial lenses used with point sources. For synchrotrons, the input end of the lens device usually needs to be aligned with the direction of the X-rays entering them, whereas with a point source all channels are oriented towards a point, with a parallel beam the input ends will normally be parallel. And for a dispersed source which is isotropically divergent from each point, the input channels can be parallel, oriented at a single point on the source, or any angle in between.

Synchrotron beams diverge in the horizontal plane (e.g., National Synchrotron Light Source X17 wiggler beam has a divergence of 5 mrad). A Kumakhov lens makes it possible to transform a divergent beam into a quasi-parallel one. Parallelism may be obtained on about $0.1\theta_{cr}$ where $\theta_{cr}$ is the critical reflection angle (i.e., we may obtain a divergence of 0.1 mrad on a glass C-52 lens for 30 keV photons. In one example, initial beam losses will be about 30–40%.

The suggested optics can effectively focus synchrotron radiation beams into a very small spot, eventually less than 1 micron will be possible. The intensity in such a small spot may be increased by greater than $10^4$.

Figure 18:
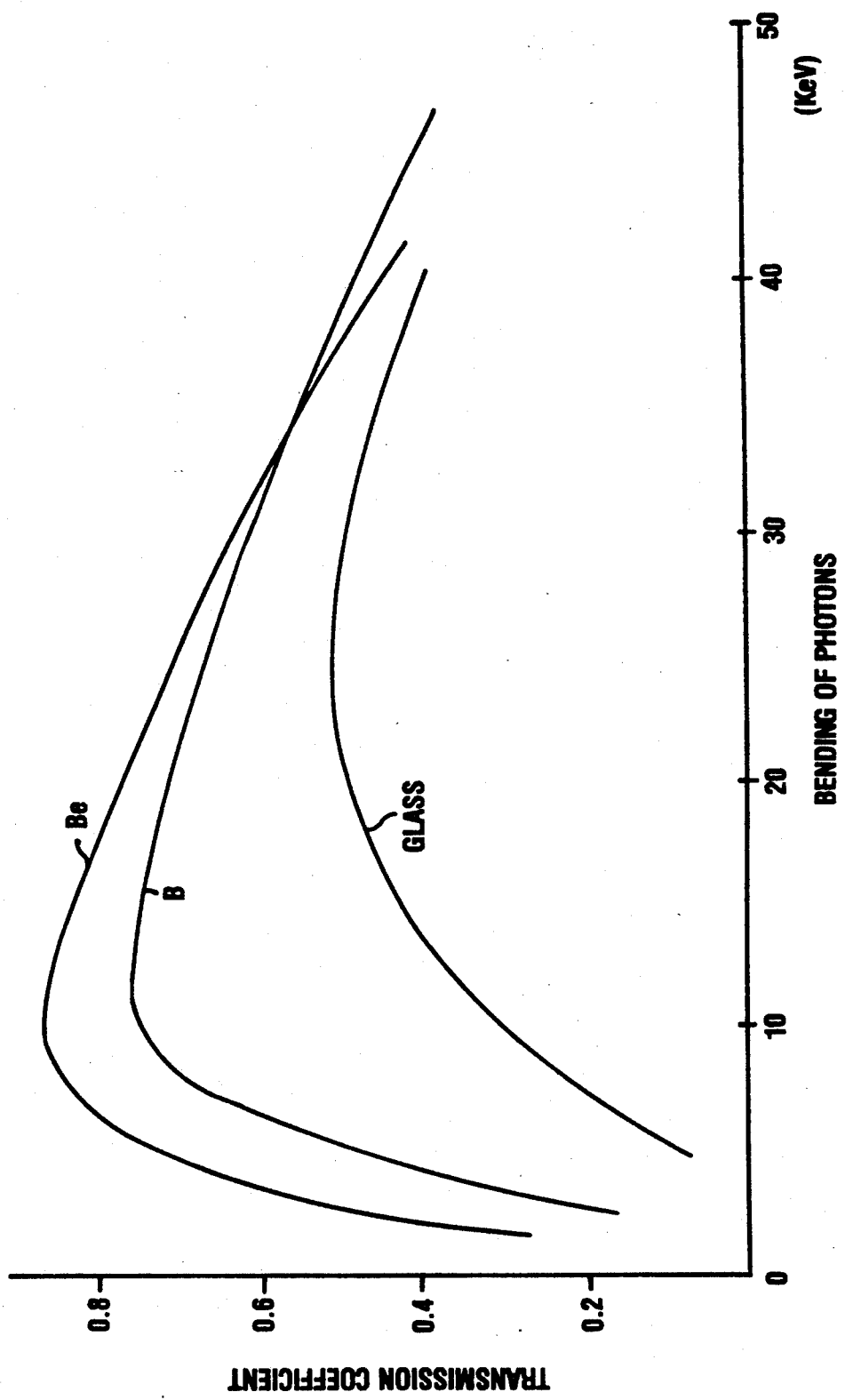
FIG. 18 shows a typical graph of transmission coefficient vs. energy for bending of photons.

Capillary optics allow turning of high energy photons through large angles. FIG. 18 shows the dependence of transmission coefficients for photons turning 90° for different materials and for a range of energies. It can be seen that 10–30 keV photons may be turned with only a 30% intensity loss. Such a high efficiency is connected with the high reflectivity of the capillaries' inner surface.

Synchrotron beams have a small cross section and low divergence. Typically a beam might start out at about 0.5 mm×0.5 mrad and even less. This makes it possible to obtain wide beams with an exceptionally small divergence using Kumakhov lenses (e.g., if we need to transform a synchrotron radiation beam into a parallel beam with the size L, using the Louiville theorem we may in principle obtain divergence $\theta$, established from the formula $l_o\theta_o = L\theta$. If $l_o\theta_o = 0.25$ mm×mrad and $L \approx 10$ cm, $\theta = 2.5 \times 10^{-6}$ rad.

In order to obtain supercollimated synchrotron beams, the ends of the channels have to be tapered out, getting wider.

Filtering out high energy photons or high energy particles is extremely difficult using conventional equipment and is a common problem for many applications and a wide variety of source types. For parallel beams such as synchrotrons a monochromatic beam can be obtained by using a crystal-monochromator. However, higher energy harmonics appear which are extremely difficult to remove.

One of the useful features of the Kumakhov lens is its ability to transmit a broad band of photon and particle energies. On the other hand, the energies transmitted can be controlled and this control can be used for a variety of applications. The control can result from selective absorption by choice of the lens materials, and selective transmission by selection of the lens design parameters. Although control is possible for photons and particles such as neutrons, the examples discussed will be for X-rays.

Control of the spacing of the lens elements (for lenses made from capillaries of circular cross section this will be the capillary inside diameter) and the curvature of lens elements also provide control of the transmission band width. In general, small spacing and large curvature increases the transmission of high energy photons, and large spacing and small radius of curvature enhances the transmission of low energy photons. In general, the transmission is optimized when the dimensionless parameter $\gamma \geq 1.00$ when $$\gamma = \frac{R(\theta_{cr})^2}{2D}$$

where R is the radius of curvature of the lens element, $\theta_{cr}$ is the critical angle of total external reflection and D is the channel width of the individual capillary for a capillary based lens. The effective transmission band width can be as small as a few Kev by choice of the materials and parameters, but is usually greater than about +10–20 keV. Selection of the energy band width to eliminate background due to low energy photon electron multiple scattering or Compton scattering o thermal diffuse scattering of high energy photons can be advantageous for many applications.

By selecting the material making up the interior surface of the lens elements the photon energies transmitted can be controlled. For example, a copper coating will transmit photons from about 0.6 to about 1 keV and about 6–10 keV. In general, low energy photons are selectively absorbed although a coating with beryllium will give efficient transmission down to photon energies as low as 100 eV.

Glass capillaries possess a very good inner surface and their reflection coefficient is very high at angles $\leq \theta_{cr}$ (e.g., at E=30 keV ($\theta_{cr}=1.11\times 10^{-3}$ rad) the single reflection coefficient $R_1=0.995$ if $\theta_{incid}=10^{-3}$ rad, which is noticeably higher than the reflection coefficient of polished surfaces. At the same time at $\theta \geq \theta_{cr}$, the reflection coefficient sharply decreases (e.g., at $\theta_{incid}=1.1\times 10^{-3}$, $R_1=0.987$, and at $\theta_{incid}=1.2\times 10^{-3}$, $R_1$ 1 has already decreased to 0.2. That means a 10% change in the incidence angle leads to a nearly 5 times decrease in the reflection coefficient).

This phenomenon of sharp reduction of $R_1$ near $\theta_{cr}$ may be very effectively used for filtering if photons make several reflections. But in order to be able to filter selectively using this technique the beam must have a very small divergence. This very condition characterizes synchrotron radiation (e.g., vertical beam divergence in the NSLS is near $10^{-4}$ rad).

Table 1 lists calculated high energy filtering for E=30 and 33 keV.

TABLE 1

N = number of reflections; $R^N$ = reflection coefficient
$\gamma$ = ratio $R^N$(30 keV)/$R^N$(33 keV)

| N | 1 | 5 | 10 |
|---|---|---|---|
| $R^N$ (30 keV) | 0.984 | 0.92 | 0.85 |
| $R^N$ (33 keV) | 0.3 | $2.7 \times 10^{-3}$ | $5.0 \times 10^{-6}$ |
| $\gamma$ | 3.28 | 383 | $1.44 \times 10^5$ |

As it is clear from the table, after 10 reflections the intensity of 33 keV photons is reduced by over 5 orders of magnitude compared to 30 keV photons. the intensity of 30 keV photons stays practically the same.

It was suggested before calculating this example that the beam enters a straight capillary at an angle of $1.1 \times 10^{-3}$ rad.

This method can be used up to very high energies including the $\gamma$ range.

Figure 19:
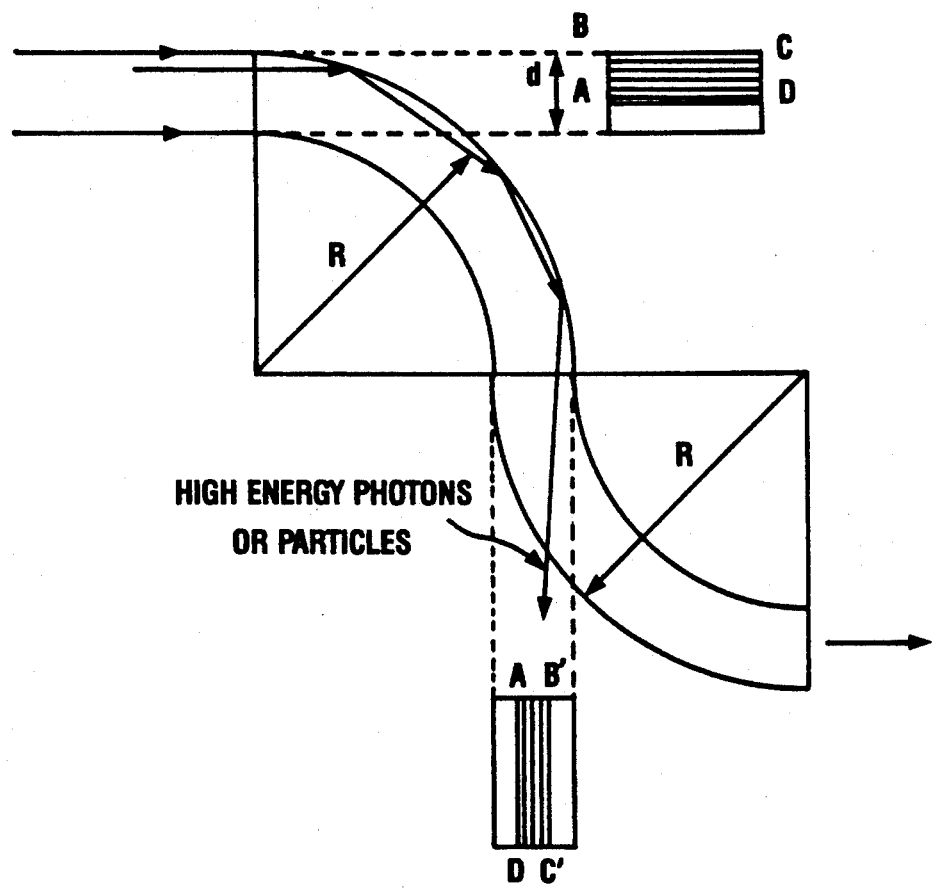
FIG. 19 shows a capillary of a special geometry near the capillary inflection point illustrating photons traveling from one wall to the other.

By providing the capillary a special geometry (FIG. 19), near the capillary's inflection point, photons travel from one wall to the other. In order for them to stay in the channel, the entrance angle in relation to this new surface has to be smaller than the critical angle. As high energy photons have small reflection angles, they leave the capillary.

Figure 20:
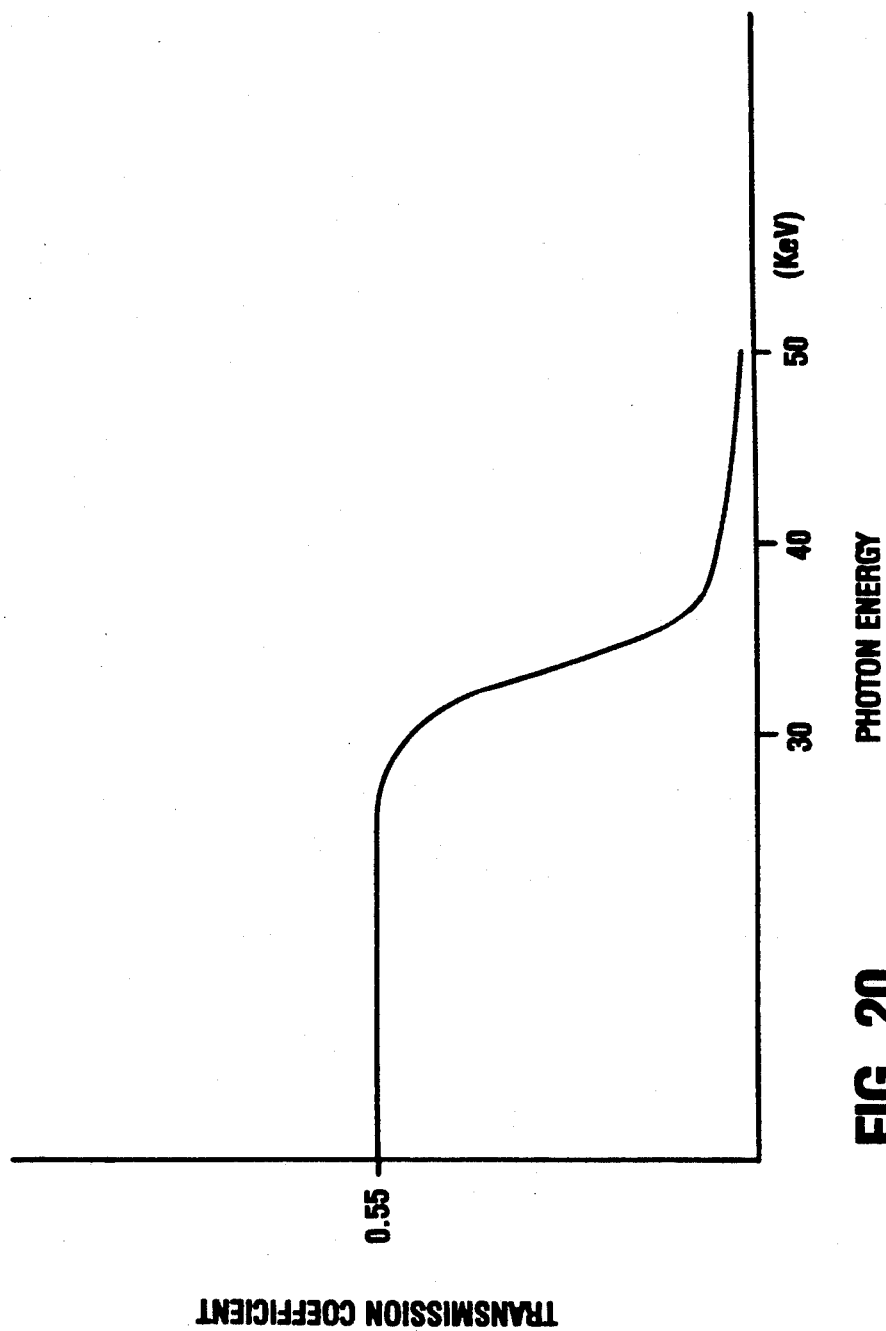
FIG. 20 shows a typical graph of transmission coefficient vs. photon energy for a special geometry which provides a high energy cutoff.

FIG. 20 shows experimental results for a divergent beam from a point source. The transmission of photons with E=40 keV decreases by an order as compared to photons with E=33 keV, and the transmission of 50 keV photons is reduced down to $10^{-4}$.

By changing the capillary's radius of curvature, the filtering border is changed. Decreasing the radii decreases the filtering energy, and vice versa.

The result shown in FIG. 20 is that for the first experiments. By specially shaping the capillary, the sharpness of energy filtering can be increased.

A capture with capillaries at an angle to the beam makes it possible to effectively cut the beam over a very narrow energy range, obtaining two separate beams, one including the energies higher than the selected energy and the other beam including the energies lower than the selected energy. This is possible because many of those photons which strike a surface at an angle larger than the Fresnel angle simply pass through the material. At higher energies only a small percent of the photons are absorbed.

Figure 21A:
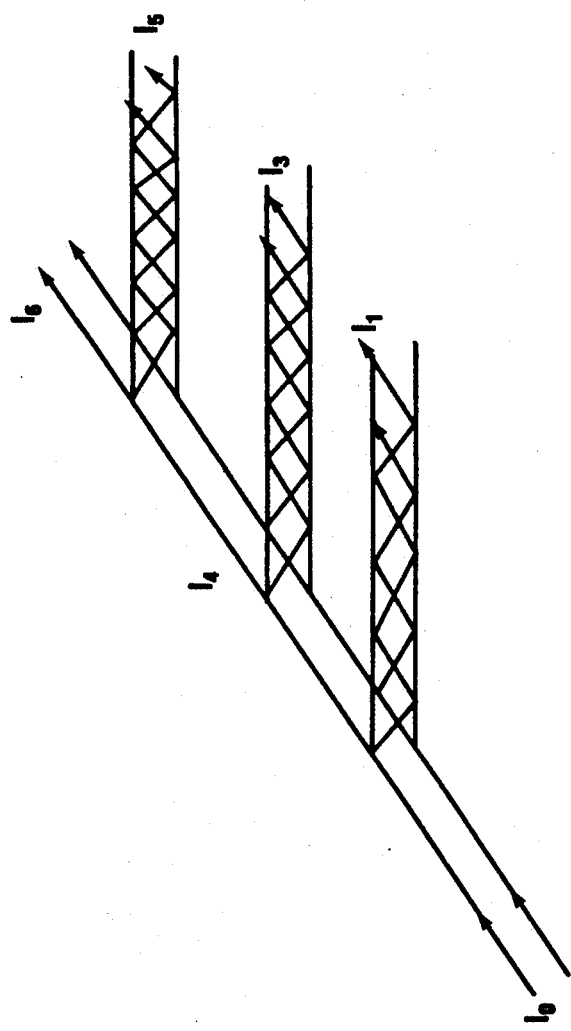
FIG. 21A shows a series of rectangular capillaries and reflection of the initial parallel beams.
Figure 21B:
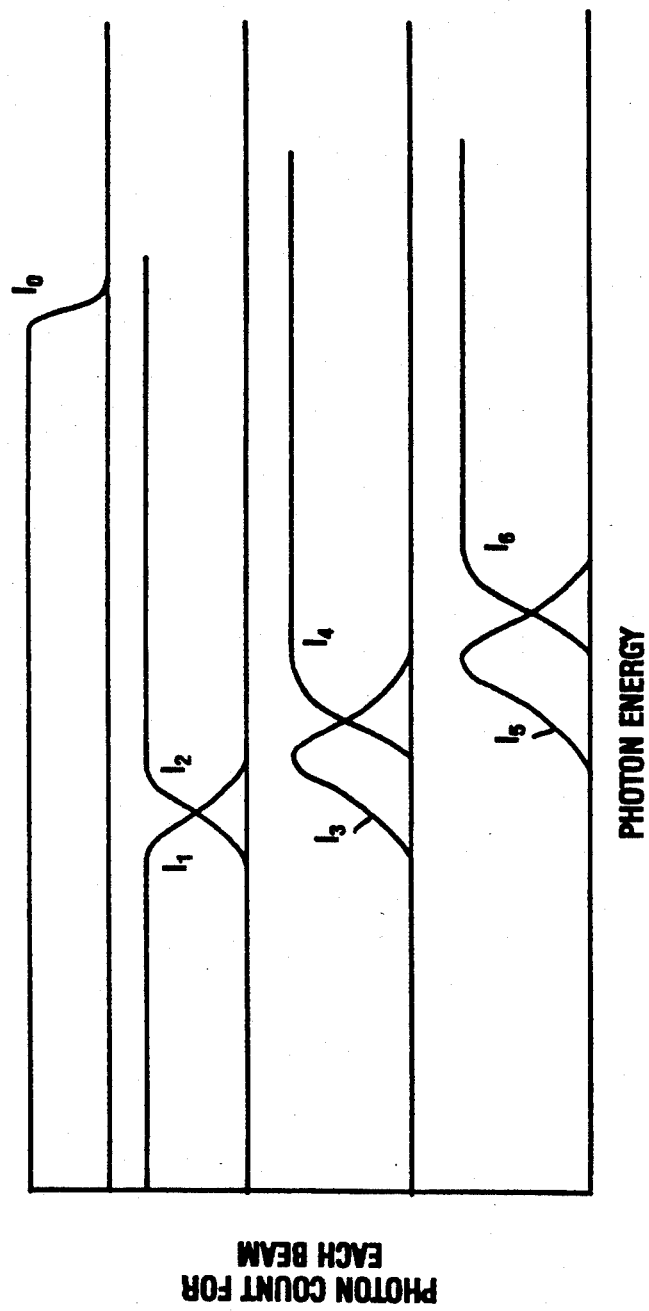
FIG. 21B shows a graph of photon count from each beam vs. photon energy, with the two beams $I_1$ and $I_2$ showing special distributions.

To use this design, the beam must have low divergence. Best results are obtained from using a rectangular capillary or system of rectangular capillaries or flat surfaces. Referring to FIG. 21A, if the initial parallel beam, $I_0m$ strikes a surface or capillary opening at an angle $\theta_0$, those photons with a $\theta_{critical} > \theta_0$ are reflected, and those photons with a higher energy and therefore their $\theta_{critical} < \theta_0$ pass through. Therefore, two beams are obtained $I_1$ and $I_2$, with spectral distribution as shown in FIG. 21B.

By using the above technique more than once it is possible to tailor a narrow band width. For example, if beam $I_2$ from FIG. 21A encounters another capillary, flat surface, or capillary system at an angle of incidence, $\theta_1$, slightly less than that of the first surfaces encountered, $\theta_0$, then those photons with $\theta_1 < \theta_{critical} < \theta_0$ will be reflected as beam $I_3$. $I_3$'s spectral distribution is shown in FIG. 21B. Similarly, multiple band widths can be selected by continuing the process, e.g. resulting in beam $I_5$ in FIG. 21B. Out of a synchrotron beam it is possible to achieve quasi-monochromatic beams which have a beam width with a ratio of energy width/energy of a few $10^{-2}$ with only a 50% loss in beam intensity in the energies represented. By using such a tailored band width it is possible to obtain a much higher flux quasi-monochromatic beam than would be in the monochromatic beam obtained from a crystal monochromator. And multiple narrow band width beams can be obtained at desired energies.

Frequently, the photon intensity is so large that absorption of even a small fraction of incident photons will result in heating to temperatures of hundreds of degrees—sometimes exceeding the melting point of metals and frequently producing large thermal gradients with accompanying mechanical stress and deformation. This effect is particularly serious from absorption in isolating windows, diffracting crystals or deflecting mirrors. To accommodate the large photon flux intensity at the input of a Kumakhov lens, a number of design features can by included.

Figure 25:
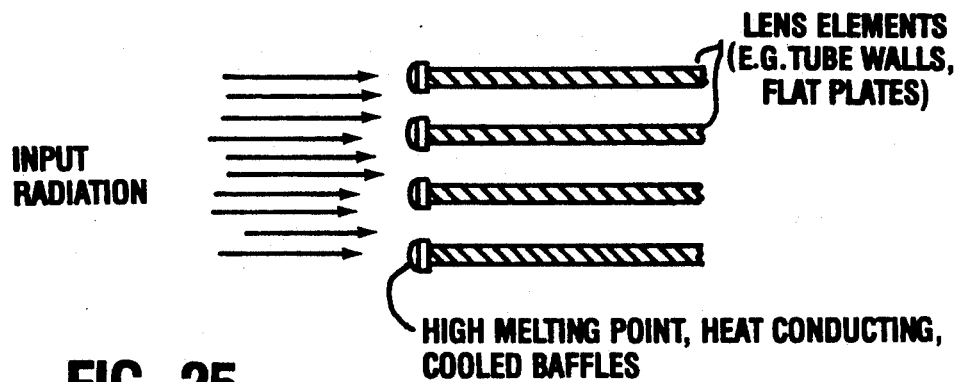
FIG. 25 shows input baffling of a lens element.

FIG. 25 shows that input baffling baffles may be hollow and cooled with flowing fluid (liquid or gas), or may be solid and cooled by coils on the surface or at the periphery.

By stopping the radiation that would otherwise strike and be stopped by the ends of the lens elements, the lens is kept from heating. The radiation entering the lens elements strike the wall of the lens at different distances from the entrance because of the gentle curvature (less than the critical angle for the total external reflection of the highest energy photons transmitted) and therefore are distributed over a very much larger area than oblique incidence.

The lens itself may be fabricated from high melt temperature glass, ceramic or metal materials. For example, fabrication from pure $SiO_2$ (quartz) will allow temperatures as high as 2000° C. before distortion in melting will interfere with photon transmission. The lens elements may also be coated with high melting thermally conducting elemental or compound materials such as tungsten, silicon carbide, carbon, etc.

Figure 26:
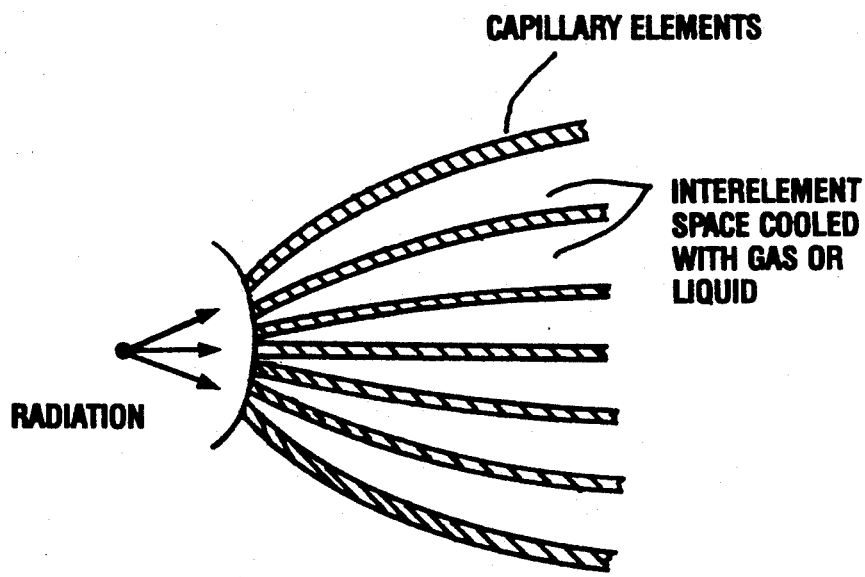
FIG. 26 shows capillary elements with the inter-element space cooled with a fluid (gas or liquid)

The lens elements may also be cooled by:

i: surrounding them with solid material of high thermal conductivity which is then cooled by openings in the bulk or the periphery through which liquid gas is passed, or which have specially attached cooling fins of high cross-sectional area; or ii: passing a fluid (liquid or gas) coolant between the lens elements. It is possible to do this even though the lens is operated in a vacuum since the walls of the lens elements serve as a vacuum barrier (see, FIG. 26);

iii: passing a cooling gas through the lens. This can be done when high energy photons are being transmitted if a cooling gas is chosen such as helium which has high thermal conductivity and low absorption cross section for the transmitted photons.

An important use of a Kumakhov lens is to control the direction and cross-section of a radiation beam. Beam cross-sections can be reshaped to achieve desired cross-sections by designing the surfaces. For example, if capillaries are used it is clearly possible to capture a thin rectangular beam such as might come from a synchrotron and by so orienting the capillaries or capillary bundles (polycapillaries) (see, for example, FIG. 27), emit a square or circular beam. This can be particularly advantageous on the synchrotron if an area with a vertical dimension larger than the vertical dimension of the original beam must be irradiated. A synchrotron beam has been broadened from 1 mm to a quasi-parallel beam of 6 cm with only a 50% loss of intensity.

The input shape of the transmitting lens can be configured to accommodate the shape of the beam such as the photon beam emerging from the synchrotron. For the synchrotron this shape will in general be asymmetric because of the tangential emission from the particle storage ring and the fan shape of the radiation field, but it can be any arbitrary shape to accommodate the beam coming from the source.

It is even possible to deflect the beam through angles of 90° or larger in order to, for example, irradiate vertical targets instead of having to irradiate horizontal targets.

As it is possible to turn beams, it is also possible to split beams and separate the beams. This has been experimentally demonstrated.

Because in certain embodiments of the Kumakhov lens, some of the portions of the beam are turned through larger angles than others or are turned on smaller radii than other sections of the beam, these portions of the beam may have higher losses. Methods for controlling intensity across the beam cross-section (usually to obtain uniform intensity) already discussed include variable filtering and selectively extending the lengths of some channels to increase losses in that portion of the beam. The drawbacks to both of these methods is that control of intensity is obtained by increasing losses, i.e., decreasing photon intensity thereby decreasing the efficiency of the lens. A method of controlling intensity across the beam which does not suffer from this drawback is modifying the spacing between channels, so the spacing is larger where intensity should be decreased and smaller where intensity should be increased. In this way photons are redistributed rather than filtered out. The drawback of this method is that microhomogeneity is decreased.

Many types of sources are subject to spatial instability, including synchrotron beams which are subject to certain fluctuations. A Kumakhov lens can capture radiation from an area which may exceed the size of the source. Therefore, small shifts of the source's location do not practically affect the intensity, parallelism, and uniformity of the photon beam which comes from the Kumakhov lens. This makes it possible to stabilize the source's spatial location.

Figure 22:
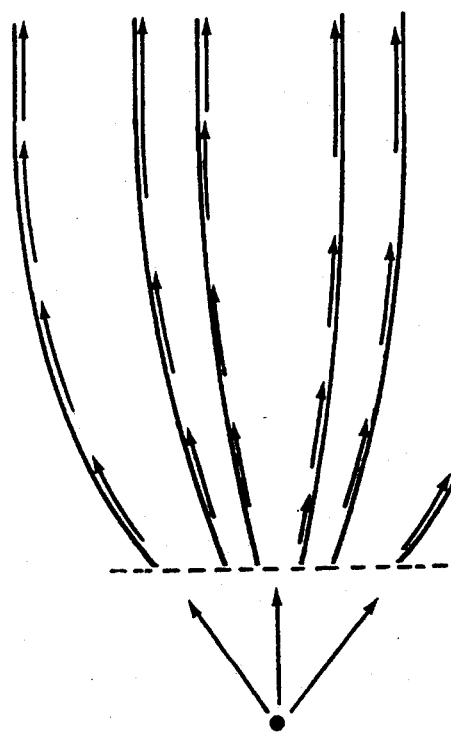
FIG. 22 shown obtaining beams using variable width capillaries with their size diminishing towards their entrance end.

In order to obtain small divergence it is possible to use barrel-shaped capillaries with their size diminishing towards their entrance end. (FIG. 22). In this case if the source's size is small enough and the channel's curvature radius is great enough we may obtain at the exit a divergence much smaller than the critical reflection angle.

Figure 23:
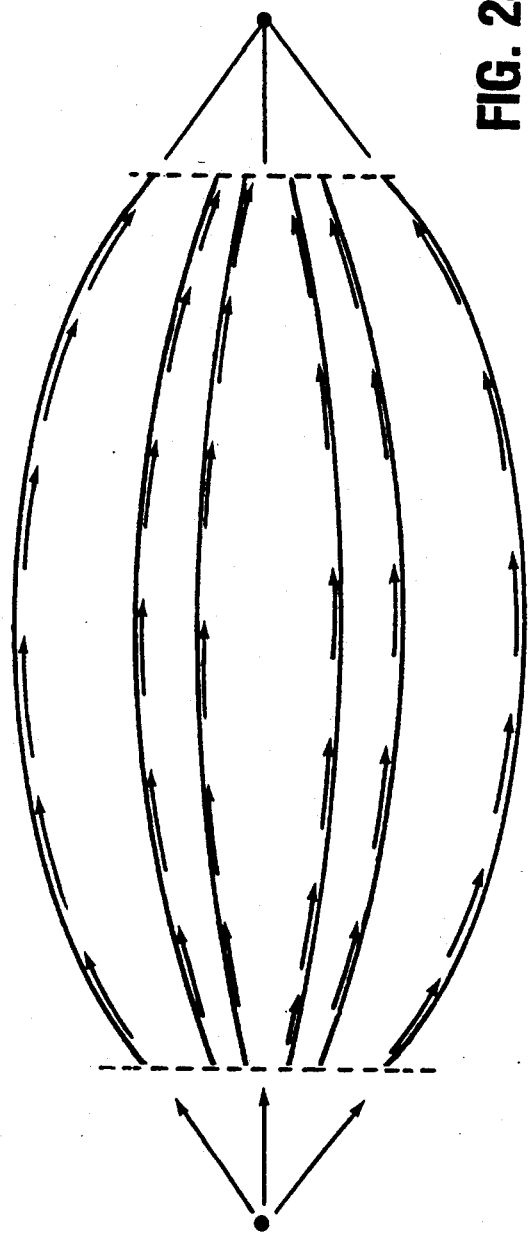
FIG. 23 shows a lens with non-uniform channel cross sections which produces a small focal spot.

To obtain a small focal spot we may converge this lens (FIG. 23).

Figure 24:
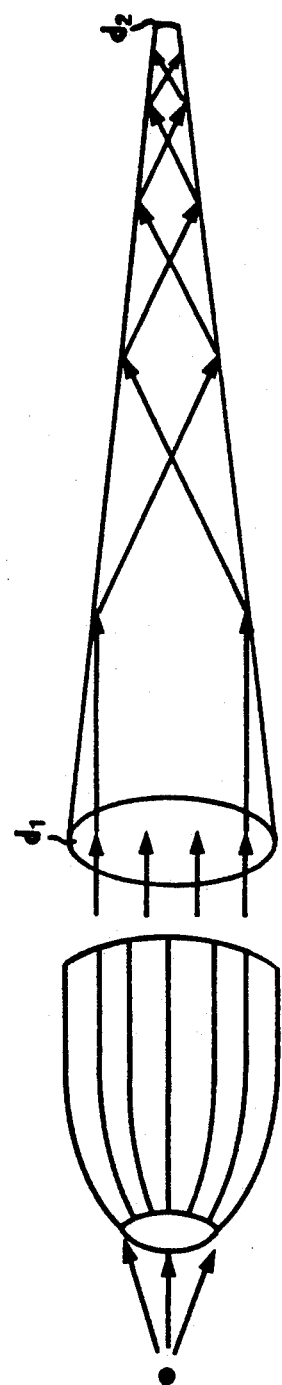
FIG. 24 shows an asymetrical lens system which obtains a small spot of high intensity radiation from a divergent source.

To obtain high intensity radiation from a divergent source we may use the geometry shown in FIG. 24. A half-barrel is located after the source, it transforms divergent radiation into a quasi-parallel beam, then there is a cone-shaped capillary. If the divergence after the half-barrel equals $\theta_1$, the ratio between the larger end diameter $d_1$ to the smaller one $d_2$ may be of the order of:

$$\frac{d_1}{d_2} \approx \frac{\theta_{cr}}{\theta_1}$$

where $\theta_{cr}$ is the complete external reflection (CER) angle. The minimum dimension of $d_1$ for X-ray photons is limited by diffraction and is $\sim c/wp$ (c is light speed, wp is plasmal frequency), i.e. about 100 Å. For ions, this dimension may be brought down to atomic sizes.

Channel cross-sections need not be circular. For example, channels for tailoring narrow energy width beams often have a flat side and may be rectangular. Capillaries, capillary bundles, and individual channels in polycapillaries are often not circular as other shapes such as hexagonal, rectangular, and triangular can provide more efficient packing leading to higher open area in the lens cross section and to higher strength.

Lenses for controlling ions are most effective if the material the channels are formed from or a coating of the channels is electrically conducting so that an electrostatic space charge will not be built up which will electrically repel the ions. And surface finishes are especially critical.

For controlling neutrons, the surface of the channels should be selected so there are no materials which have a high absorption cross-section for neutrons. For example, glass capillaries containing boron have an extremely low efficiency for neutrons.

Kumakhov lenses can be designed to serve many functions simultaneously. For example, a single lens might capture divergent radiation and form a quasi-parallel beam as well as selectively filter the photon energies, and compensate for higher losses in the outer channels.

The invention described hereinabove is mainly an illustration of the principle of controlling gamma and X-ray radiation and particles, and is, therefore, accompanied by a description of specific embodiments thereof. It will be apparent to those skilled in this art, that various modifications, substitutions, additions and the like can be made without departing from the spirit of the invention, the scope of which is defined by the claims which follow and their equivalents.

What is claimed is:

1. A device for controlling beams of particles, X-ray and gamma quanta, comprising a plurality of channels having inner surfaces exhibiting multiple total external reflections, input butt-ends facing a radiation source, and output butt-ends aimed at a radiation receiver, said channels being formed by channel-forming elements located along generatrices of imaginary controlled surfaces, said channel-forming elements are rigidly located relative to one another at multiple locations by means of a rigid support structure, said plurality of channel supporting means being mounted along said channels with a spacing of supports less than, or equal to, the spacing at which sagging of the channel-forming elements begins to interfere with beam propagation for the radiation spectrum for which high transmission efficiency is desired.

2. A device as claimed in claim 1, wherein the radial width D of the input butt-end of each of said channels is less that $D_1 \leq 2\theta_D F + D$, where:

$D_1$ is the effective diameter of said radiation source from which radiation is captured by the lens, $\theta_D$ is the minimum critical angle of total external reflection in a specified spectral band, and F is the distance of said radiation source to the input butt-end of the channel, measured along said central axis.

3. A device as claimed in claim 1, wherein said channels are formed by tubes.

4. A device as claimed in claim 3, wherein at least one of said tubes comprises multiple channels or a bundle of capillaries.

5. A device as claimed in claim 3, wherein said rigid support structure comprises bushings encircling each tube, the bushings being rigidly fitted to one another such as by adhesive, interlocking mechanisms or clamping devices.

6. A device as claimed in claim 3, wherein the rigid support structure is formed by a compound filling gaps between the tubes.

7. A device as claimed in claim 3, wherein at least one of said channel supporting means is selectively translatable along central axis relative to other of said channel supporting means.

8. A device as claimed in claim 1, wherein the rigid support structure is comprised of discs or plates positioned at an angle to the longitudinal direction of the tubes with said discs or plates having apertures to accommodate and lock the tubes.

9. A device as claimed in claim 8, wherein the discs or plates are positioned normal to the central axis of beam propagation.

10. A device as claimed in claim 8, wherein the apertures in the discs or plates are positioned in a honeycomb pattern.

11. A device as claimed in claim 1, wherein said rigid support structures are formed by the walls of said channels being rigidly linked by their outer surfaces.

12. A device as claimed in claim 11, wherein channel width is variable along the length of said channels.

13. A device as claimed in claim 12, wherein the channel width of each channel is variable along the length of each channel and proportional to the diameter of the device in each cross section of said device.

14. A device as claimed in claim 12, wherein the channel width at the input end is less than is necessary to achieve $$\frac{R(\theta_{cr})^2}{2D} > 1$$

where R is the radius of curvature of the channel, $\theta_{cr}$ is the critical angle of total external reflection for the energy of interest and D is the width of the channel, in order to obtain an exit divergence less than the critical angle.

15. A device as claimed in claim 12, wherein the width of said channels at the output end is greater than or equal to their width at the input end.

16. A device as claimed in claim 1, wherein said channels are formed by gaps between reflective layers.

17. A device as claimed in claim 16, wherein said rigid support structures are rigidly mounted at the input and output butt ends of said channels.

18. A device as claimed in claim 17, wherein said rigid support structures are open-celled grids.

19. A device as claimed in claim 16, wherein said rigid support structures are formed of a lower density material located between the reflecting surfaces.

20. A device as claimed in claim 1, wherein said channel forming elements are located coaxial to the central axis of beam propagation.

21. A device as claimed in claim 20, wherein said rigid support structure is rotatably mounted around the central axis of beam propagation.

22. A device as claimed in claim 1, wherein the input ends of the channels are oriented to capture divergent radiation.

23. A device as claimed in claim 1, wherein the input ends of the channels are oriented to capture parallel radiation.

24. A device as claimed in claim 1, wherein the output end of the channels are oriented to form a convergent beam.

25. A device as claimed in claim 1, wherein the output ends of the channels are oriented to form a quasi-parallel beam.

26. A device as claimed in claim 25, wherein a planar crystal is placed in the quasi-parallel beam resulting in Bragg diffraction.

27. A device as claimed in claim 25, wherein the length of each channel is chosen to provide a desired attenuation of radiation flux to control intensity across the beam cross section.

28. A device as claimed in claim 27, wherein a quasi-parallel beam is formed with the variation in channel length being in the straight sections at the output butt-ends.

29. A device as claimed in claim 1, wherein absorption filtering controls intensity across the beam cross section.

30. A device as claimed in claim 29, wherein a quasi-parallel beam is formed.

31. A device as claimed in claim 29, wherein the filter is made by a lithography process by exposing a material to a radiation beam formed by the device.

32. A device as claimed in claim 1, wherein the spacing at the butt-end between the channels is not constant across the device cross section, with the spacing being chosen to control intensity across the beam cross section.

33. A device as claimed in claim 1, wherein the output end of the channels are flared outward to reduce divergence of the beam.

34. A device as claimed in claim 33, wherein a quasi-parallel beam is formed.

35. A device as claimed in claim 33, wherein the flared output end of the channels has a taper angle less than or equal to $\theta - DL_1$, where $\theta$ is a specified divergence angle of the quasi-parallel beam and $L_1$ is the length of the conical tube section.

36. A device as claimed in claim 1, wherein the direction of the central axis of beam propagation varies.

37. A device as claimed in claim 1, wherein the beam cross section changes in shape.

38. A device as claimed in claim 1, wherein the beam is split or beams are combined.

39. A device as claimed in claim 1, wherein the channel forming elements have compound curvature.

40. A device as claimed in claim 39, wherein divergent radiation is captured, when a quasi-parallel beam is formed.

41. A device as claimed in claim 39, wherein said channel-forming elements extend along generatrices of imaginary toroidal surfaces conjugate to corresponding ones of said barrel-shaped surfaces.

42. A device as claimed in claim 1 further comprising a partial or complete external casing made of material opaque to the controlled beam radiation, said casing having apertures aligned with the butt-ends of said channels.

43. A device as claimed in claim 42, wherein straight line transmission of radiation between said apertures is blocked.

44. A device as claimed in claim 1, wherein said rigid supporting means comprises stackable cradle members.

45. A device as claimed in claim 1, wherein said channel-forming elements are bent along a fixed uniform bend of constant radius.

46. A device as claimed in claim 1, wherein selected energy ranges of the radiation spectrum have higher transmission efficiency than other energies.

47. A device as claimed in claim 46, wherein transmission efficiency for different energies is controlled on the basis of different energies having different critical angles of total external reflection.

48. A device as claimed in claim 47, wherein transmission efficiency is accomplished by means of multiple reflections at angles near the critical angle of the highest energy for which high transmission efficiency is desired.

49. A device as claimed in claim 47, wherein the transmission efficiency is accomplished by using a compound curvature of the channels where the photons or particles travel from one wall to a different wall of the channels.

50. A device as claimed in claim 47, wherein the curvatures and cutoff energies are adjustable.

51. A device as claimed in claim 47, wherein the radiation beam strikes the channel walls at an angle such that only radiation with a critical angle greater than or equal to a specified angle enters the channels.

52. A device as claimed in claim 51, wherein additional channel entrances are located in the portion of the beam not captured by the first set of channels, wherein said additional channel entrances are positioned with the channels walls positioned at an angle to the radiation smaller than the angle of the first set of channels, and wherein said additional channel entrances capture radiation bands with smaller critical angles than those captured by the first set of channels.

53. A device as claimed in claim 47, wherein the channels have flat surfaces or rectangular cross section.

54. A device as claimed in claim 46, wherein differential transmission efficiency is accomplished by varying materials to obtain selective absorption.

55. A device as claimed in claim 54, wherein the selective absorption is by the material of the channel walls.

56. A device as claimed in claim 54, wherein the absorption is by the material coating the channel walls.

57. A device as claimed in claim 1, wherein the device is cooled.

58. A device as claimed in claim 57, wherein said cooling is done using input baffles.

59. A device as claimed in claim 58, wherein said input baffles are hollow and cooled with flowing fluid.

60. A device as claimed in claim 58, wherein said input baffles are cooled on the surface or the periphery.

61. A device as claimed in claim 57, wherein the channel forming elements are surrounded with a thermally conductive material that is cooled.

62. A device as claimed in claim 57, wherein the device is cooled by a fluid coolant flowing about the channel forming elements.

63. A device as claimed in claim 57, wherein the device is cooled by a fluid flowing through the channels.

64. A device as claimed in claim 1, wherein the channel forming elements are made of material with a high softening temperature.

65. A device as claimed in claim 64, wherein the channels are coated with thermally-conductive, high melting point materials.

66. A device as claimed in claim 1, wherein a beam of charged particles is to be controlled, where said channel forming elements are made of or coated with electrically conductive material.

67. A device as claimed in claim 1, wherein a quasi-parallel beam is formed and directed into a tapered capillary which decreases in width along its length.

68. A device as claimed in claim 67, wherein $D_1/d_2$ is approximately equal to $\theta_{cr}/\theta$, where $d_1$ is the width of the said tapered capillary, at its widest point and of $d_2$ is the width of said tapered capillary at its narrowest point $\theta$ is the beam divergence of the quasi-parallel beam entering the said tapered capillary, and $\theta_{cr}$ is the critical angle for total external reflection.

69. A device as claimed in claim 1, wherein the spacing of supports is less than, or equal to, $(12EI/QR_1)^{\frac{1}{2}}$, where E is the elasticity modulus of said channels, I is the moment of inertia of the cross section of said channels relative to its neutral axis, Q is the weight of said channels per unit length, and $R_1 = 2D/Q^2$ and is the critical radius of bending of said channels as defined by a specified high energy boundary of a radiation spectrum for which high transmission efficiency is desired.

* * * * *

(12) EX PARTE REEXAMINATION CERTIFICATE (5327th)
United States Patent
Kumakhov

(10) Number: US 5,192,869 C1
(45) Certificate Issued: Apr. 11, 2006

(54) DEVICE FOR CONTROLLING BEAMS OF PARTICLES, X-RAY AND GAMMA QUANTA

(75) Inventor: Muradin A. Kumakhov, Moscow (RU)

(73) Assignee: X-Ray Optical Systems, Inc., Voorheesville, NY (US)

Reexamination Request:
No. 90/005,777, Jul. 13, 2000

Reexamination Certificate for:
Patent No.: 5,192,869
Issued: Mar. 9, 1993
Appl. No.: 07/678,208
Filed: Apr. 1, 1991

Related U.S. Application Data

(63) Continuation-in-part of application No. 07/607,456, filed on Oct. 31, 1990, now abandoned.

(51) Int. Cl.
*G02B 5/124* (2006.01)

(52) U.S. Cl. .............. 250/505.1; 313/103 CM
(58) Field of Classification Search .............. 250/505.1; 313/103 CM, 105 CM; 378/34, 35
See application file for complete search history.

(56) References Cited

U.S. PATENT DOCUMENTS

| | | | |
|---|---|---|---|
| 3,821,510 A | 6/1974 | Muncheryan | 219/121 L |
| 4,266,548 A | 5/1981 | Davi | 128/303.1 |
| 4,418,689 A | 12/1983 | Kanazawa | 128/6 |
| 4,583,539 A | 4/1986 | Karlin et al. | 128/303.1 |
| 4,669,467 A | 6/1987 | Willett et al. | 128/303.1 |
| 4,780,903 A | 10/1988 | Soezima | 378/145 |
| 4,788,975 A | 12/1988 | Shturman et al. | 128/303.1 |
| 4,887,282 A | 12/1989 | Mueller | 378/34 |
| 4,987,582 A | 1/1991 | Webster et al. | 378/85 |

FOREIGN PATENT DOCUMENTS

| | | |
|---|---|---|
| DE | DT 18 03 806 B | 6/1970 |
| DE | DD 240 091 A1 | 10/1986 |
| GB | 1 227 929 | 4/1971 |
| GB | 1 474 955 | 5/1977 |
| JP | 42-21460 | 10/1967 |
| JP | 56-067806 | 6/1981 |
| JP | 59-072052 | 4/1984 |
| JP | 5-27840 | 1/1985 |
| JP | 60-033227 | 2/1985 |
| JP | 62-106352 | 5/1987 |
| JP | 7-40080 | 12/1987 |
| JP | 01-185497 | 7/1989 |
| JP | 7-11600 | 1/1990 |
| JP | 02-216100 | 8/1990 |
| RU | 1322888 | 7/1984 |
| RU | 1597009 | 9/1988 |

(Continued)

OTHER PUBLICATIONS

Kumakhov, M.A., "Radiation of Channeled Particles in Crystals", Moskow, Energoatomizdat, p. 35, second paragraph from the bottom, (1986).

(Continued)

*Primary Examiner*—Kiet T. Nguyen

(57) ABSTRACT

A device for controlling beams of particles, X-rays and gamma rays including a plurality of channels with total external reflection inner surfaces, input butt-ends facing a radiation source and output butt-ends aimed at a radiation receiver is taught. Channel-forming elements are in the form of surfaces, tubes, and structures with multiple channels and are rigidly positioned one relative to another with a spacing between supports such that the sagging of the channel-forming elements does not interfere with beam propagation. The device can be used to capture radiation from sources which produce parallel or divergent radiation. The resulting beam or beams can be of a variety of shapes or angular orientations including quasi-parallel, convergent, and split beams. Energy filtering is accomplished by selective absorption of radiation by the channel-forming elements and by selective reflection, by geometrics which cause some energies to be discriminated against because of the angle of total external reflection associated with that energy.

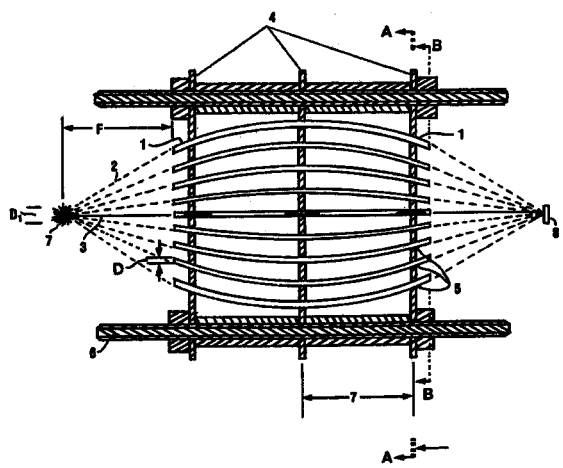

FOREIGN PATENT DOCUMENTS

| RU | 1769623 | 12/1989 |
|---|---|---|
| RU | 1776149 | 2/1990 |
| RU | 1702811 | 4/1990 |
| SU | 1322888 A1 | 7/1984 |
| WO | WO 88/01428 | 2/1988 |

OTHER PUBLICATIONS

Kumakhov, M.A., "Channeling of Photons and New X–Ray Optics", *Nuclear Instruments and Methods In Physics Research, B48,* pp. 283–286, (Mar. 1990).

Kapany, N.S., "Fiber Optics Principles and Applications", *Academic Press Inc.,* pp. 137–138, (1967).

Kovantsev, V.E. et al., "X–Ray Probe Version of Local X–Ray Spectral Method of Analysis", the I.V. Kurchatov Institute of Atomic Energy, pp. 1–5 (1991).

Dr. Woldseth, "X–Ray Energy Spectrometry", Kevex Corporation, pp. 41–42, 70, 81, Figure 2.28, p. 83 and p. 130 (1973).

Electronics. Encyclopedic Dictionary. "Soviet Encyclopedy". Moscow, 1990, pp. 254–257.

"The IV–th All–Union Conference on Interaction of Radiation with Solids", *Book of Abstracts,* pp. 1–187 (May 15–19, 1990). Elbrus settlement, Kabardino–Balkarian ASSR, USSR.

Kumakhov; Irradiation of Charged Particles In Crystals (Energoatomizdat, Moscos 1986) p. 36—RUSSIAN.

Arkadjev; Poverkhn. Fiz. Khim. Mekh. No. 2 pp 44–47 (1987)—RUSSIAN.

Arkadjev; Pis'ma Zh; Tekh vol. 14 pp. 97–98 (1988)—RUSSIAN.

Excerpt from the Book of Abstracts from the "III–rd All–Union Conference on Radiation of Relativistic Particles in Crystals," May 25–30, 1988, in Naltchik, pp. 174–223.

Kolomijtsev et al., Abstract of "Focusing x–ray optical systems for soft radiation", The III All–Union Conference on Radiation of Relativistic Particles in Crystals, May 25–30, 1988, pp. 199–200.

Gubarev et al., Abstract of "Oriented Detector for x–ray radiation", The III All–Union Conference on Radiation of Relativistic Particles in Crystals, May 25–30, 1988, pp. 205–206.

Arkadiev et al., Abstract of "Transportation of X–ray Radiation through Curved Capillary X–ray Guides", The III All–Union Conference on Radiation of Relativistic Particles in Crystals, May 25–30, 1988, pp. 218–219.

Kumakov et al, "Multiple Reflection from Surface X–ray Optics", Physics Reports, vol. 191, No. 5, pp. 291–348 (Aug. 1990) (hereinafter "Multiple Reflection Article").

Arkadiev et al., "Design of a Wide–Pass–Band System for Focusing a Hard X–ray Radiation", Central Research Institute for Scientific Information and Economical Studies on Atomic Science and Technology, pp. 1–45 (1988).

Gubarev et al., "X–Ray Waveguide Quasiparallel Beam Forming Systems", the IV–th Union Conference on Interaction of Radiation with Solids Book of Abstracts, pp. 181 (May 15–19, 1990).

Arkadiev et al., "Wide–Band x–ray Optics with a large angular aperture", Soviet Physics Usp. vol. 32, No. 3, pp. 271–275 (Mar. 1989).

Bukreev et al., "X–Ray Optical System with a Variable Focal Length", the IV–th Union Conference on Interaction of Radiation with Solids Book of Abstracts, pp. 99 (May 15–19, 1990).

Kovantsev et al., Abstract of "Capillary x–ray optical devices for transformation of divergent beam into the parallel one", The III All–Union Conference on Radiation of Relativistic Particles in Crystals, May 25–30, 1988, pp. 214–215.

Jangobegov et al., "Elemental Base of the X–Ray Guides", the IV–th Union Conference on Interaction of Radiation with Solids Book of Abstracts, pp. 73 (May 15–19, 1990).

Andreevsky et al., "X–Ray Waveguide System with a Variable Cross–Section of the Sections", the IV–th Union Conference on Interaction of Radiation with Solids Book of Abstracts, pp. 177–178 (May 15–19, 1990).

Gubarev et al., "Study of Polycapillary X–Ray Waveguides in the 5–80 KEV X–ray Energy Range", the IV–th Union Conference on Interaction of Radiation with Solids Book of Abstracts, pp. 179–180 (May 15–19, 1990).

Kovantsev et al., Abstract of "System with coaxial surfaces of rotation for x–ray radiation focusing", The III All–Union Conference on Radiation of Relativistic Particles in Crystals, May 25–30, 1988, pp. 216–217.

Altchagirov et al., Abstract of "Laminated system for the soft x–ray radiation focusing", The III All–Union Conference on Radiation of Relativistic Particles in Crystals, May 25–30, 1988, pp. 189–190.

Gubarev et al., "On the Possibility of Creating Restricting X–ray Filters with a Controllable Short–Wave Border on the Basis of Polycapillary X–ray Waveguides", the IV–th Union Conference on Interaction of Radiation with Solids Book of Abstracts, pp. 173–174 (May 15–19, 1990).

Kolomitsev et al., "Point–Source X–ray Lithography with the Use of X–Ray Optical Systems", the IV–th Union Conference on Interaction of Radiation with Solids Book of Abstracts, pp. 88–89 (May 15–19, 1990).

*Encyclopedia of Modern Machinery. Automatization of production and industrial electronics,* vol. 3, Moscow, Soviet Encyclopedia, pp. 274–275 (1964)—partial translation of pp. 274–275 provided with portion of Russian encyclopedia.

Fayazov et al., "Design of wide–range soft x–ray optics systems", the IV–th Union Conference on Interaction of Radiation with Solids Book of Abstracts, p. 94 (May 15–19, 1990).

Gubarev et al., "On Increasing the Effectiveness of Radiation Transportaion through Capillary X–Ray Waveguides", the IV–th Union Conference on Interaction of Radiation with Solids Book of Abstracts, pp. 182–183 (May 15–19, 1990).

Arkadiev et al., Abstract of "Principle possibilities of a sliding incidence x–ray optics in the hard range", The III All–Union Conference on Radiation of Relativistic Particles in Crystals, May 25–30, 1988, pp. 185–186.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 4 are determined to be patentable as amended.

Claims 2, 3 and 5–69, dependent on an amended claim, are determined to be patentable.

New claims 70–92 are added and determined to be patentable.

1. A device for controlling beams of particles, X-ray and gamma quanta, comprising a plurality of channels having inner surfaces exhibiting multiple total external reflections, input butt-ends facing a radiation source, and output butt-ends aimed at a radiation receiver, said channels being formed by channel-forming elements located along generatrices of imaginary controlled surfaces, *said channel-forming elements formed from individual bundles of hollow capillaries,* said channel-forming elements are rigidly located relative to one another at multiple locations by means of a rigid support structure, said plurality of channel supporting means being mounted along said channels with a spacing of supports less than, or equal to, the spacing at which sagging of the channel-forming elements begins to interfere with beam propagation for the radiation spectrum for which high transmission efficiency is desired.

4. A device as claimed in claim 3, wherein at least one of said tubes comprises [multiple channels or] a bundle of capillaries.

*70. A device as claimed in claim 4, wherein said rigid support structure is formed by the walls of said tubes being rigidly linked by their outer surfaces.*

*71. A device as claimed in claim 70, wherein channel width is variable along the length of said channels.*

*72. A device as claimed in claim 71, wherein channel width of each channel is variable along the length of each channel and proportional to the diameter of the device in each cross section of said device.*

*73. A device as claimed in claim 70, wherein said channel forming elements are spatially located with a rigid honeycomb structure formed by the walls of the tubes rigidly fitted to one another.*

*74. A device as claimed in claim 4, wherein the individual bundles of capillaries comprise pluralities of interconnected capillaries.*

*75. A device as claimed in claim 74, wherein the rigid support structure is formed by the walls of the tubes rigidly fitted to one another by their external surfaces.*

*76. A device as claimed in claim 75, wherein channel width is variable along the length of said channels.*

*77. A device as claimed in claim 76, wherein the channel width of each channel is variable along the length of each channel and proportional to the diameter of the device in each cross section of said device.*

*78. A device as claimed in claim 75, wherein said channel forming elements are spatially located with a rigid honeycomb structure formed by the walls of the tubes rigidly fitted to one another.*

*79. A device as claimed in claim 74, wherein channel width is variable along the length of said channels.*

*80. A device as claimed in claim 79, wherein the channel width of each channel is variable along the length of each channel and proportional to the diameter of the device in each cross section of said device.*

*81. A device as claimed in claim 74, wherein said individual bundles are drawn by thermoplastic heating.*

*82. A device as claimed in claim 11, wherein said channel forming elements are spatially located with a rigid honeycomb structure formed by the walls of the channels rigidly fitted to one another.*

*83. A device as claimed in claim 1, wherein each channel-forming element comprises a plurality of interconnected capillaries.*

*84. A device as claimed in claim 83, wherein the interconnected capillaries are grouped into said individual bundles of capillaries.*

*85. A device as claimed in claim 84, wherein the individual bundles of capillaries have external surfaces and wherein the individual bundles of capillaries are rigidly fitted to one another by their external surfaces.*

*86. A device as claimed in claim 85, wherein channel width is variable along the length of said channels.*

*87. A device as claimed in claim 86, wherein the channel width of each channel is variable along the length of each channel and proportional to the diameter of the device in each cross section of said device.*

*88. A device as claimed in claim 85, wherein said channel forming elements are spatially located with a rigid honeycomb structure formed by the walls of the channel forming elements rigidly fitted to one another.*

*89. A device as claimed in claim 84, wherein said individual bundles are drawn by thermoplastic heating.*

*90. A device as claimed in claim 83, wherein said individual bundles are drawn by thermoplastic heating.*

*91. A device as claimed in claim 1, wherein channel width is variable along the length of said channels.*

*92. A device as claimed in claim 91, wherein the channel width of each channel is variable along the length of each channel and proportional to the diameter of the device in each cross section of said device.*

* * * * *